(12) United States Patent
Kindo

(10) Patent No.: US 11,161,521 B2
(45) Date of Patent: Nov. 2, 2021

(54) AUTONOMOUS DRIVING EVALUATION APPARATUS AND AUTONOMOUS DRIVING EVALUATION METHOD

(71) Applicant: TOYOTA JIDOSHA KABUSHIKI KAISHA, Toyota (JP)

(72) Inventor: Toshiki Kindo, Yokohama (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 538 days.

(21) Appl. No.: 16/037,420

(22) Filed: Jul. 17, 2018

(65) Prior Publication Data

US 2019/0061776 A1 Feb. 28, 2019

(30) Foreign Application Priority Data

Aug. 29, 2017 (JP) .............................. JP2017-164460

(51) Int. Cl.
| | |
|---|---|
| *B60W 50/04* | (2006.01) |
| *G05D 1/00* | (2006.01) |
| *B60W 30/10* | (2006.01) |
| *B60W 30/16* | (2020.01) |
| *G06F 30/15* | (2020.01) |
| *B60W 50/06* | (2006.01) |
| *B60W 40/09* | (2012.01) |

(Continued)

(52) U.S. Cl.
CPC ............ *B60W 50/04* (2013.01); *B60W 30/10* (2013.01); *B60W 30/16* (2013.01); *B60W 50/06* (2013.01); *G05D 1/0088* (2013.01); *G06F 30/15* (2020.01); *B60W 40/09* (2013.01); *B60W 2050/0031* (2013.01); *B60W 2556/10* (2020.02); *G05D 2201/0213* (2013.01); *G06F 30/20* (2020.01)

(58) Field of Classification Search
CPC ......... B60W 50/04; B60W 2050/0031; B60W 2050/0001; B60W 30/10; B60W 30/16; B60W 50/06; B60W 2556/10; B60W 40/09; G05D 1/0088; G05D 2201/0213; G06N 5/00; G06F 30/15; G06F 30/20
USPC .......................................................... 703/6
See application file for complete search history.

(56) References Cited

U.S. PATENT DOCUMENTS

| | | | | |
|---|---|---|---|---|
| 9,463,797 | B2 * | 10/2016 | Damerow | ......... B60W 30/0956 |
| 10,127,818 | B2 * | 11/2018 | Mandeville-Clarke | ...................... B62D 15/025 |
| 10,372,089 | B2 * | 8/2019 | Azuma | ................ G05B 13/048 |

(Continued)

FOREIGN PATENT DOCUMENTS

| | | |
|---|---|---|
| JP | 10-268749 A | 10/1998 |
| JP | 2009169912 A * | 7/2009 |

(Continued)

*Primary Examiner* — Kamini S Shah
*Assistant Examiner* — John E Johansen
(74) *Attorney, Agent, or Firm* — Sughrue Mion, PLLC

(57) ABSTRACT

An autonomous driving evaluation apparatus includes: an initial traffic scene setting unit configured to set an initial traffic scene, an initial state of the moving object model, and a road environment in which the autonomous driving vehicle model and the moving object model are disposed; a past traffic scene calculation unit configured to calculate a past traffic scene in which the autonomous driving vehicle model and the moving object model are involved at a past time point back traced from a time point of the initial traffic scene; and a performance evaluation unit configured to evaluate a performance of the autonomous driving algorithm.

8 Claims, 10 Drawing Sheets

| RESULT OF BACKWARD CALCULATION | COMPLIANCE WITH LAWS AND REGULATIONS OF AUTONOMOUS DRIVING VEHICLE MODEL IN PAST TRAFFIC SCENE | COMPLIANCE WITH LAWS AND REGULATIONS OF MOVING OBJECT MODEL IN PAST TRAFFIC SCENE | RESULT OF FORWARD CALCULATION | RESULT OF EVALUATION | CONTENT OF EVALUATION |
|---|---|---|---|---|---|
| UNSTABLE | REGARDLESS | REGARDLESS | REGARDLESS | OK | AUTONOMOUS DRIVING ALGORITHM MAKES SITUATION AVOID REACHING THE INITIAL TRAFFIC SCENE |
| STABLE | COMPLIANCE | COMPLIANCE | NOT IN IRREGULAR RELATIONSHIP | OK | AUTONOMOUS DRIVING ALGORITHM MAKES SITUATION REACHES INITIAL TRAFFIC SCENE BUT AUTONOMOUS DRIVING VEHICLE MODEL AND MOVING OBJECT MODEL ARE NOT IN IRREGULAR RELATIONSHIP |
| | COMPLIANCE | COMPLIANCE | IN IRREGULAR RELATIONSHIP | NG | AUTONOMOUS DRIVING ALGORITHM MAKES SITUATION REACHES INITIAL TRAFFIC SCENE AND AUTONOMOUS DRIVING VEHICLE MODEL AND MOVING OBJECT MODEL ARE IN IRREGULAR RELATIONSHIP |
| | VIOLENCE | REGARDLESS | REGARDLESS | OK | AUTONOMOUS DRIVING ALGORITHM DOES NOT MAKE SITUATION REACH INITIAL TRAFFIC SCENE UNLESS THERE IS ABNORMAL SITUATION THAT AUTONOMOUS DRIVING VEHICLE MODEL BECOMES TO BE IN LEGAL VIOLATION STATE |

(51) Int. Cl.
  *G06F 30/20* (2020.01)
  *B60W 50/00* (2006.01)

(56) References Cited

U.S. PATENT DOCUMENTS

| 10,996,643 | B2* | 5/2021 | Larimore | G06F 30/20 |
| 2015/0234383 | A1* | 8/2015 | Tanigawa | G05D 1/0246 |
| | | | | 701/28 |
| 2015/0266477 | A1 | 9/2015 | Schmüdderich | |
| 2017/0161414 | A1 | 6/2017 | Kible et al. | |

FOREIGN PATENT DOCUMENTS

| JP | 2015-182764 A | 10/2015 |
| JP | 2016-192010 A | 11/2016 |
| JP | 2016-192910 A | 11/2016 |
| JP | 2017-105453 A | 6/2017 |

\* cited by examiner

Fig. 9

| RESULT OF BACKWARD CALCULATION | COMPLIANCE WITH LAWS AND REGULATIONS OF AUTONOMOUS DRIVING VEHICLE MODEL IN PAST TRAFFIC SCENE | COMPLIANCE WITH LAWS AND REGULATIONS OF MOVING OBJECT MODEL IN PAST TRAFFIC SCENE | RESULT OF FORWARD CALCULATION | RESULT OF EVALUATION | CONTENT OF EVALUATION |
|---|---|---|---|---|---|
| UNSTABLE | REGARDLESS | REGARDLESS | REGARDLESS | OK | AUTONOMOUS DRIVING ALGORITHM MAKES SITUATION AVOID REACHING THE INITIAL TRAFFIC SCENE |
| STABLE | COMPLIANCE | COMPLIANCE | NOT IN IRREGULAR RELATIONSHIP | OK | AUTONOMOUS DRIVING ALGORITHM MAKES SITUATION REACHES INITIAL TRAFFIC SCENE BUT AUTONOMOUS DRIVING VEHICLE MODEL AND MOVING OBJECT MODEL ARE NOT IN IRREGULAR RELATIONSHIP |
| STABLE | COMPLIANCE | COMPLIANCE | IN IRREGULAR RELATIONSHIP | NG | AUTONOMOUS DRIVING ALGORITHM MAKES SITUATION REACHES INITIAL TRAFFIC SCENE AND AUTONOMOUS DRIVING VEHICLE MODEL AND MOVING OBJECT MODEL ARE IN IRREGULAR RELATIONSHIP |
| STABLE | VIOLENCE | REGARDLESS | REGARDLESS | OK | AUTONOMOUS DRIVING ALGORITHM DOES NOT MAKE SITUATION REACH INITIAL TRAFFIC SCENE UNLESS THERE IS ABNORMAL SITUATION THAT AUTONOMOUS DRIVING VEHICLE MODEL BECOMES TO BE IN LEGAL VIOLATION STATE |

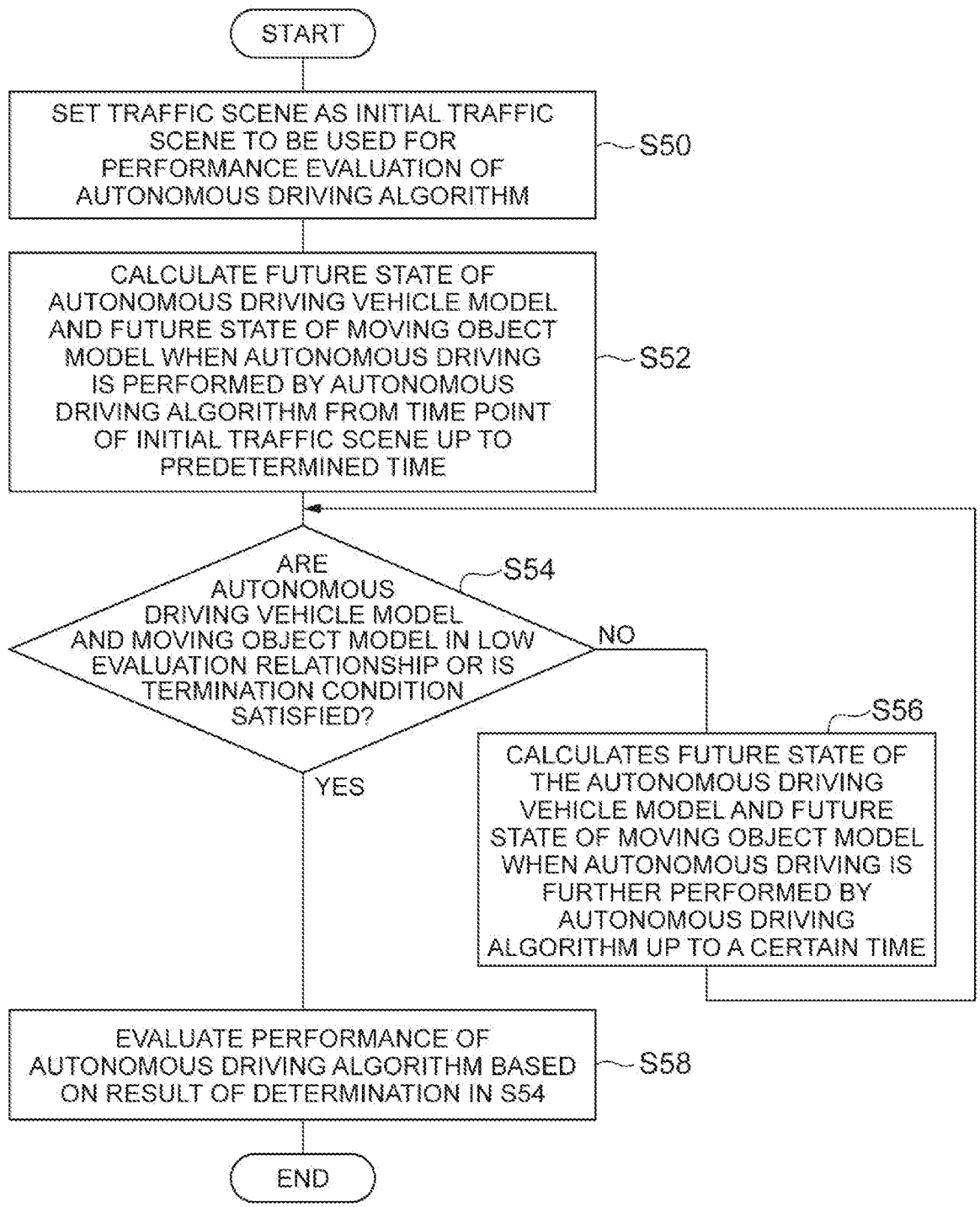

AUTONOMOUS DRIVING EVALUATION APPARATUS AND AUTONOMOUS DRIVING EVALUATION METHOD

TECHNICAL FIELD

The present disclosure relates to an autonomous driving evaluation apparatus and an autonomous driving evaluation method that evaluate an autonomous driving algorithm.

BACKGROUND

In the related art, Japanese Unexamined Patent Publication No. 2017-105453 is known as technical literature relating to an evaluation of a function of autonomous driving. In this literature, a method is disclosed, in which a vehicle object for the autonomous driving and another vehicle object are driven in an electronic game environment, and the function of the autonomous driving is evaluated from a behavior of the vehicle object for the autonomous driving corresponding to the behavior of the other vehicle object.

CROSS-REFERENCE TO RELATED APPLICATION

This application claims the benefit of priority from Japanese Patent Application No. 2017-164460, filed Aug. 29, 2017, the entire contents of which are incorporated herein by reference.

SUMMARY

Incidentally, in the evaluation method in the related art described above, an initial traffic scene in which the vehicle object for the autonomous driving is involved is set, and the function of the autonomous driving is evaluated from the behavior of the vehicle object by the autonomous driving algorithm after a certain time elapses from the initial traffic scene. As an initial traffic situation, for example, a situation can be assumed, in which the vehicle object for autonomous driving and the other vehicle object may collide with each other if the two vehicle objects travel straight ahead. However, the autonomous driving algorithm is expected to control the vehicle object such that the situation does not fall into the initial traffic scene from the beginning, and thus, there is a room for improvement in the evaluation of the autonomous driving algorithm.

Therefore, in the present technical field, it is desirable to provide an autonomous driving evaluation apparatus or an autonomous driving evaluation method that can appropriately evaluate the autonomous driving algorithm.

In order to solve the problems described above, according to an aspect of present disclosure, there is provided an autonomous driving evaluation apparatus for evaluating an autonomous driving algorithm by a simulation, the apparatus including:

an initial traffic scene setting unit configured to set an initial traffic scene in which an autonomous driving vehicle model and a moving object model are involved by setting an initial state of the autonomous driving vehicle model on which an autonomous driving is performed using the autonomous driving algorithm, an initial state of the moving object model, and a road environment in which the autonomous driving vehicle model and the moving object model are disposed; a past traffic scene calculation unit configured to calculate a past traffic scene in which the autonomous driving vehicle model and the moving object model are involved at a past time point back traced from a time point of the initial traffic scene based on the initial traffic scene; and a performance evaluation unit configured to evaluate a performance of the autonomous driving algorithm based on the past traffic scene.

According to the autonomous driving evaluation apparatus in the aspect of the present disclosure, the past traffic scene which is back traced from the initial traffic scene is calculated and the performance of the autonomous driving algorithm is evaluated based on the past traffic scene.

The autonomous driving evaluation apparatus according to the aspect of the present disclosure may further include: a comparison past traffic scene generation unit configured to generate a preset number of comparison past traffic scenes at the past time point by minutely varying the past traffic scene; and an autonomous driving reflected scene calculation unit configured to respectively calculate an autonomous driving reflected scene after a time set in advance elapses from the past traffic scene under a state in which the autonomous driving is performed on the autonomous driving vehicle model by the autonomous driving algorithm, and calculate a comparison autonomous driving reflected scene after a time set in advance elapses from the comparison past traffic scene under a state in which the autonomous driving is performed on the autonomous driving vehicle model by the autonomous driving algorithm. The performance evaluation unit may be configured to evaluate the performance of the autonomous driving algorithm based on the initial traffic scene, the past traffic scene, the comparison past traffic scene, the autonomous driving reflected scene, and the comparison autonomous driving reflected scene.

According to the autonomous driving evaluation apparatus described above, the autonomous driving reflected scene is calculated from the past traffic scene at the past time point and the comparison past traffic scene is calculated from a plurality of comparison past traffic scenes at the past time point, and then, the autonomous driving algorithm is evaluated based on the autonomous driving reflected scene and the comparison past traffic scene. Therefore, according to the autonomous driving evaluation apparatus described above, by reflecting the autonomous driving algorithm, it becomes possible to recognize the tendency of stable convergence or unstable divergence toward the initial traffic scene from the past traffic scene and the comparison past traffic scene, and thus, it is possible to appropriately evaluate the performance of the autonomous driving algorithm against the initial traffic scene.

In the autonomous driving evaluation apparatus according to the aspect of the present disclosure, the past traffic scene calculation unit may be configured to repeatedly calculate the states of the autonomous driving vehicle model and the states of the moving object model at the time points that are time points back traced from time point of the initial traffic scene by a predetermined time length, and to calculate the past traffic scene at a time point in which both the state of the autonomous driving vehicle model and the state of the moving object model are in a legal compliance state set in advance as the past time point.

According to the autonomous driving evaluation apparatus described above, since the past traffic scene is calculated at the time when both the state of the autonomous driving vehicle model and the state of the moving object model become the preset legal compliance state as the past time point by temporally back tracing the time by a predetermined time length from the time point of the initial traffic scene, adoption of the past traffic scene of the legal violation state which is inappropriate for the precondition of the evaluation of the autonomous driving algorithm can be avoided, and thus, it is possible to appropriately evaluate the autonomous driving algorithm.

The autonomous driving evaluation apparatus according to the aspect of the present disclosure may be configured to further include: a future state calculation unit configured to calculate a future state of the autonomous driving vehicle model when the autonomous driving is performed using the autonomous driving algorithm from the time point of the initial traffic scene and a future state of the moving object model that performs movement set in advance from the time point of the initial traffic scene based on the initial state of the autonomous driving vehicle model, the initial state of the moving object model, and the road environment; and a relationship determination unit configured to determine whether or not the autonomous driving vehicle model and the moving object model are in a low evaluation relationship based on the future state of the autonomous driving vehicle model and the future state of the moving object model. The performance evaluation unit may be configured to evaluate the performance of the autonomous driving algorithm based on the result of determination performed by the relationship determination unit.

According to the autonomous driving evaluation apparatus described above, by calculating the future state of the autonomous driving vehicle model and the future state of the moving object model when the autonomous driving is performed using the autonomous driving algorithm from the time point of the initial traffic scene, it is possible to determine whether or not the two models are in the low evaluation relationship when the time is elapsed from the initial traffic scene while reflecting the autonomous driving algorithm. Therefore, it is possible to appropriately evaluate the autonomous driving algorithm.

According to another aspect of the present disclosure, there is provided an autonomous driving evaluation method in an autonomous driving evaluation apparatus for evaluating an autonomous driving algorithm by a simulation, the method including: setting an initial traffic scene in which an autonomous driving vehicle model and a moving object model are involved by setting an initial state of the autonomous driving vehicle model on which the autonomous driving is performed using the autonomous driving algorithm, an initial state of the moving object model, and a road environment in which the autonomous driving vehicle model and the moving object model are disposed; calculating a past traffic scene in which the autonomous driving vehicle model and the moving object model are involved at a past time point back traced from a time point of the initial traffic scene based on the initial traffic scene; and evaluating a performance of the autonomous driving algorithm based on the past traffic scene.

According to the autonomous driving evaluation method in the aspect of the present disclosure, the past traffic scene is calculated by calculating the past state of the autonomous driving vehicle model at the past time point backward from the initial traffic scene and the past state of the moving object model at the past time point, and the performance of the autonomous driving algorithm is evaluated based on the past traffic scene. Therefore, it is possible to appropriately evaluate the autonomous driving algorithm compared to a case where the past traffic scene is not taken into consideration.

The autonomous driving evaluation method according to the aspect of the present disclosure may further include: generating a preset number of comparison past traffic scenes at the past time point by minutely varying the past traffic scene;

calculating an autonomous driving reflected scene after a time set in advance elapses from the past traffic scene under a state in which the autonomous driving is performed on the autonomous driving vehicle model by the autonomous driving algorithm; calculating a comparison autonomous driving reflected scene after a time set in advance elapses from the comparison past traffic scene under a state in which the autonomous driving is performed on the autonomous driving vehicle model by the autonomous driving algorithm; and evaluating the performance of the autonomous driving algorithm based on the initial traffic scene, the past traffic scene, the comparison past traffic scene, the autonomous driving reflected scene, and the comparison autonomous driving reflected scene.

According to the autonomous driving evaluation method described above, the autonomous driving reflected scene is calculated from the past traffic scene at the past time point and the comparison past traffic scene is calculated from a plurality of comparison past traffic scenes at the past time point, and then, the autonomous driving algorithm is evaluated based on the autonomous driving reflected scene and the comparison past traffic scene. Therefore, according to the autonomous driving evaluation method described above, by reflecting the autonomous driving algorithm, it becomes possible to recognize the tendency of stable convergence or unstable divergence toward the initial traffic scene from the past traffic scene and the comparison past traffic scene, and thus, it is possible to appropriately evaluate the performance of the autonomous driving algorithm so as not to make the situation reach the initial traffic scene.

The autonomous driving evaluation method according to the aspect of the present disclosure, in the past traffic scene calculation step, the states of the autonomous driving vehicle model and the states of the moving object model at the time points that are time points back traced from a time point of the initial traffic scene by a predetermined time length are repeatedly calculated, and the past traffic scene at a time point in which both the state of the autonomous driving vehicle model and the state of the moving object model are in a legal compliance state set in advance as the past time point is calculated.

According to the autonomous driving evaluation method described above, since the past traffic scene is calculated at the time when both the state of the autonomous driving vehicle model and the state of the moving object model become the preset legal compliance state as the past time point by temporally back tracing the time by a predetermined time length from the time point of the initial traffic scene, adoption of the past traffic scene of the legal violation state which is inappropriate for the precondition of the evaluation of the autonomous driving algorithm can be avoided, and thus, it is possible to appropriately evaluate the autonomous driving algorithm.

The autonomous driving evaluation method according to the aspect of the present disclosure may further include: calculating a future state of the autonomous driving vehicle model when the autonomous driving is performed using the autonomous driving algorithm from the time point of the initial traffic scene and a future state of the moving object model that performs movement set in advance from the time point of the initial traffic scene based on the initial state of the autonomous driving vehicle model, the initial state of the moving object model, and the road environment; and determining whether or not the autonomous driving vehicle model and the moving object model are in a low evaluation relationship set in advance based on the future state of the autonomous driving vehicle model and the future state of the moving object model, and in the performance evaluation step, the performance of the autonomous driving algorithm may be evaluated based on the result of determination performed in the relationship determination step.

According to the autonomous driving evaluation method described above, by calculating the future state of the autonomous driving vehicle model and the future state of the moving object model when the autonomous driving is performed using the autonomous driving algorithm from the time point of the initial traffic scene, it is possible to determine whether or not the two models are in the low evaluation relationship when the time is elapsed from the initial traffic scene while reflecting the autonomous driving algorithm. Therefore, it is possible to appropriately evaluate the autonomous driving algorithm.

As described above, according to the autonomous driving evaluation apparatus in the aspect of the present disclosure or according to the autonomous driving evaluation method in the other aspect, it is possible to appropriately evaluate the autonomous driving algorithm.

BRIEF DESCRIPTION OF THE DRAWINGS

FIG. 9 is a table illustrating an example of a performance evaluation in the second embodiment.

FIG. 10 is a flowchart illustrating forward calculation processing.

DETAILED DESCRIPTION

Hereinafter, embodiments of the present disclosure will be described with reference to the drawings.

First Embodiment

Figure 1:
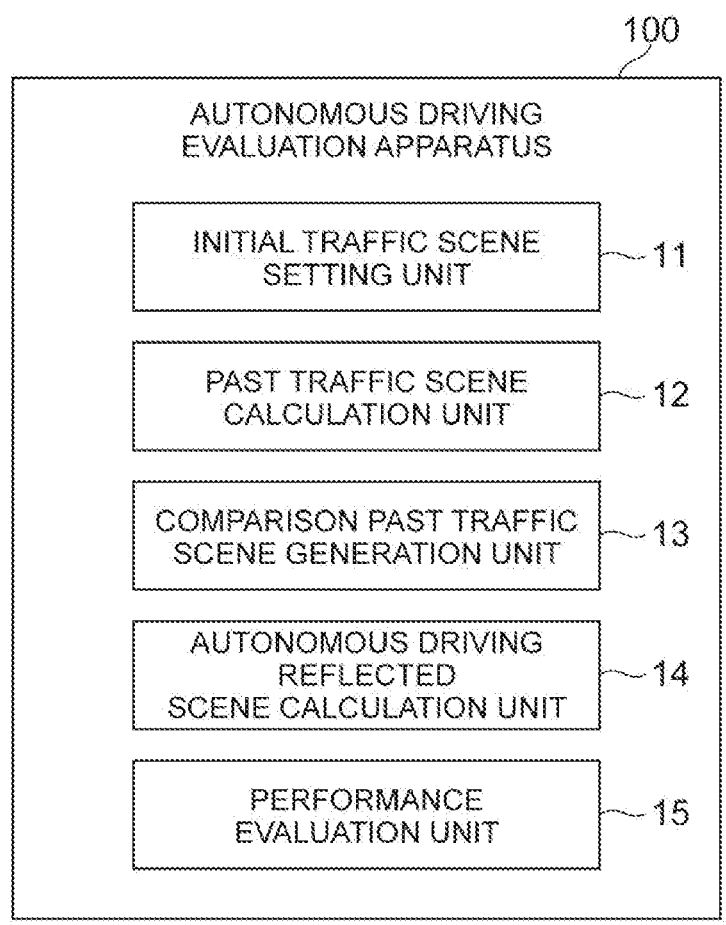
FIG. 1 is a block diagram illustrating an autonomous driving evaluation apparatus in a first embodiment.

FIG. 1 is a block diagram illustrating an autonomous driving evaluation apparatus in a first embodiment. The autonomous driving evaluation apparatus 100 illustrated in FIG. 1 is an apparatus for evaluating an autonomous driving algorithm by a simulation. The autonomous driving algorithm is an algorithm for performing the autonomous driving by controlling a vehicle capable of autonomous driving. The autonomous driving algorithm can be a stand-alone infra-cooperative algorithm. The autonomous driving is a vehicle control that causes a vehicle to autonomously travel even if the driver of the vehicle does not perform a driving operation.

The evaluation of the autonomous driving algorithm is performed by a simulation using an autonomous driving vehicle model on which the autonomous driving by the autonomous driving algorithm is reflected and a moving object model. The autonomous driving vehicle model is a model for imitating a vehicle capable of autonomous driving in the simulation in order to make the autonomous driving by the autonomous driving algorithm be reflected.

The moving object model is a model for imitating a moving object in the simulation in order for the evaluation of the autonomous driving algorithm. The moving objects include at least one of other vehicles, pedestrians, bicycles, animals, robots, personal mobility, and the like. Behavioral ranges of the models differ from each other depending on the types of the objects. For example, the vehicle model has a higher upper limit of speed and has a lower upper limit of directional angular velocity (speed of orientation change) than the pedestrian model. The behavioral range of the models are appropriately set respectively.

In the related art, as an evaluation of an autonomous driving algorithm, a method has been studied, in which a time flows from a traffic scene in which the autonomous driving vehicle model and the moving object model interfere with each other, and then, a function of an autonomous driving algorithm is evaluated based on the behavior of the autonomous driving vehicle model on which the autonomous driving algorithm is reflected. The traffic scene in which the autonomous driving vehicle model and the moving object model interfere with each other means, for example, a traffic scene in which the autonomous driving vehicle model and the moving object model may collide with each other if the two models travel straight ahead each other.

However, the autonomous driving algorithm is designed such that the autonomous driving vehicle model and the moving object model does not fall into a troublesome traffic scene (an extreme condition) such as a scene in which the two models interfere with each other from the beginning. Therefore, from the viewpoint of the evaluation of the performance, it is desirable to evaluate not the behavior of the autonomous driving algorithm when the time flows from the troublesome traffic scene, but to evaluate whether or not the autonomous driving algorithm generates a troublesome traffic scene and whether or not the autonomous driving algorithm makes the situation fall into a troublesome traffic scene.

In the autonomous driving evaluation apparatus 100, the performance of the autonomous driving algorithm is evaluated by checking whether or not the autonomous driving algorithm makes the situation fall into a traffic scene to be evaluated (an initial traffic scene described below) by an appropriate simulation using the autonomous driving vehicle model and the moving object model.

Figure 2:
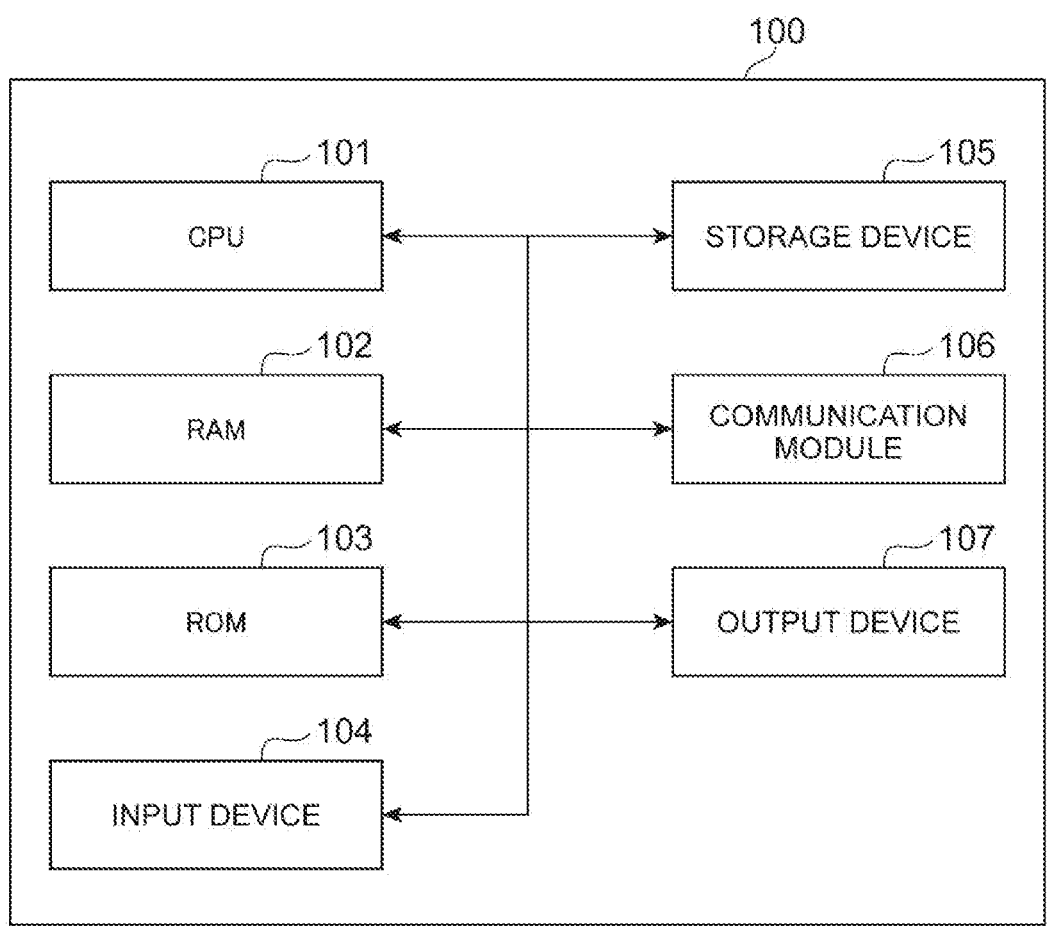
FIG. 2 is a diagram illustrating a hardware configuration of the autonomous driving evaluation apparatus.

Configuration of the Autonomous Driving Evaluation Apparatus in the First Embodiment A configuration of the autonomous driving evaluation apparatus 100 in the first embodiment will be described. First, a hardware configuration of the autonomous driving evaluation apparatus 100 will be described. FIG. 2 is a diagram illustrating the hardware configuration of the autonomous driving evaluation apparatus 100.

As illustrated in FIG. 2, the autonomous driving evaluation apparatus 100 can be physically configured as a computer that includes one or a plurality of CPUs 101, random access memory (RAM) 102 and read only memory (ROM) 103, input devices 104 such as a keyboard and a mouse, a storage device 105 such as a semiconductor memory, a communication module 106 which is a data transmission and reception device such as a network card, and an output device 107 such as a display device.

The CPU 101 realizes various operations by loading various programs or the like necessary for executing the processing from the ROM 103 or the storage device 105 into the RAM 102, and executing the loaded programs. The program and the data necessary for the processing may be input via the communication module 106. The autonomous driving evaluation apparatus 100 may be configured with a plurality of computers.

Next, a functional configuration of the autonomous driving evaluation apparatus 100 will be described with reference to FIG. 1. As illustrated in FIG. 1, the autonomous driving evaluation apparatus 100 includes an initial traffic scene setting unit 11, a past traffic scene calculation unit 12, a comparison past traffic scene generation unit 13, an autonomous driving reflected scene calculation unit 14, and a performance evaluation unit 15.

The initial traffic scene setting unit 11 sets an initial traffic scene for the evaluation of the autonomous driving algorithm. The initial traffic scene is a traffic scene used as a reference for the evaluation of the autonomous driving algorithm by the simulation. The initial traffic scene includes an initial state of the autonomous driving vehicle model, an initial state of the moving object model, and a road environment in which the autonomous driving vehicle model and the moving object model are disposed.

The initial state of the autonomous driving vehicle model is a state of the autonomous driving vehicle model in the initial traffic scene. The autonomous driving algorithm is considered to make the autonomous driving vehicle mode in compliance with the laws and regulations because the algorithm is made to be in compliance with the laws and regulations. The state of the autonomous driving vehicle model includes the position, orientation, and speed of the autonomous driving vehicle model. The state of the autonomous driving vehicle model, which is subject to the algorithm evaluation, may not include a yaw rate and an acceleration (or deceleration). However, an aspect of including the yaw rate and the acceleration (or the deceleration) in the state of the autonomous driving vehicle model will not be excluded.

Similarly, the initial state of the moving object model is a state of the moving object model in the initial traffic scene. The state of the moving object model includes the position, orientation, and the speed of the moving object model. In the state of the moving object model, the yaw rate may be added, and the acceleration (or the deceleration) may be added. In the moving object model, a moving object algorithm that determines the behavior of the moving object model may be set in advance. Alternatively, a dynamic movement before and after the initial state of the moving object model may be given directly. As an example, the moving object algorithm can be an algorithm in which the moving object continues to move at the current speed toward the current orientation. The moving object algorithm may be set in advance for each type of model (vehicle, pedestrian, and the like).

The road environment is a road environment in the simulation, in which the autonomous driving vehicle model and the moving object model are disposed. The road environment may be any environment in which the vehicle can travels, and thus, may be in a parking lot. As the road environment, for example, the environment of a lane in which the autonomous driving vehicle model travels, and the environment of the lane in which the moving object model travels. The environment of the lane includes a shape of the lane, a curvature of the lane, and a width of the lane. In the road environment, information on a legal speed limit and information on a direction of the traveling lane may be set in advance. The direction of traveling lane may be determined to be either left-hand side traveling or right-hand side traveling, rather than for each lane. The road environment may also include the status of traffic signals on the lane.

Figure 3:
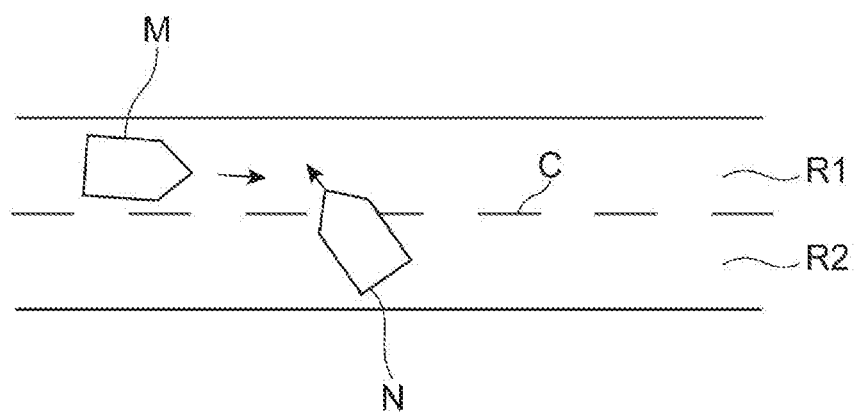
FIG. 3 is a diagram illustrating an example of an initial traffic scene.

FIG. 3 is a diagram illustrating an example of an initial traffic scene. FIG. 3 illustrates an autonomous driving vehicle model M, a moving object model (another vehicle model) N, a traveling lane R1 in which the autonomous driving vehicle model M travels, an opposing lane R2 adjacent to the traveling lane R1, a center line C between the traveling lane RI and the opposing lane R2. In the initial traffic scene illustrated in FIG. 3, the autonomous driving vehicle model M travels in the traveling lane R1. On the other hand, the moving object model N is trying to rush out in front of the autonomous driving vehicle model M crossing the opposing lane R2 and the center line C. The autonomous driving evaluation apparatus 100 performs the evaluation of the autonomous driving algorithm using such an initial traffic scene.

In a single initial traffic scene, a plurality of moving object models may be present or a plurality of autonomous driving vehicle models may be present. The initial traffic scene does not need to be a troublesome traffic scene as illustrated in FIG. 3, and the initial traffic scene does not need to be a traffic scene immediately before the autonomous driving vehicle model and the moving object model collide with each other. The initial traffic scene may be a normal traffic scene in which both the autonomous driving vehicle model and the moving object model travel in the lane at a speed within the legal speed limit.

The past traffic scene calculation unit 12 calculates a past traffic scene which is a traffic scene temporally back traced from the initial traffic scene. The past traffic scene calculation unit 12 extracts a time differential component of the initial traffic scene (such as the speed of the autonomous driving vehicle model), and calculates the past traffic scene described as a dynamical system using a backward calculation. A time point of the past traffic scene is referred to as a past time point.

The past traffic scene calculation unit 12 calculates the past traffic scene including a state of the autonomous driving vehicle model at the past time point and a state of the moving object model at the past time point. The calculation of the past traffic scene is performed as a simulation of a dynamical system, in which the temporal retracing-back is performed in an infinitesimal time using the time differential component of the initial traffic scene.

Hereinafter, an example of the backward calculation will be described. First, assuming that the state (dynamic state) of the autonomous driving vehicle model is represented by $\xi a$ and a time-flow operator is represented by $\hat{A}$, the temporal change of the state of the autonomous driving vehicle model is expressed as a following Equation (1). Here, t represents the time, and $\delta t$ represents the infinitesimal time.

Formula 1

$$\xi_a(t+\delta t) = \hat{A}(\delta t)\xi_a(t) \tag{1}$$

In addition, the state (the dynamic state) of the moving object model is represented by $\xi b$, and the time-flow operator is represented by as $F\hat{}b$. Here, it is assumed that the number of moving object models is plural, and thus, each moving object model is represented using b=1, 2, 3 . . . . In this case, the temporal change of the states of the moving object models is expressed as the following Equation (2).

Formula 2

$$\xi_b(t+\delta t) = \hat{F}_b(\delta t)\xi_b(t) \tag{2}$$

The above equations (1) and (2) can be collectively expressed as the following equations (3) and (4).

Formula 3

$$E(t+\delta t) = \begin{pmatrix} A(\delta t, E(t)) & 0 & 0 & \cdots \\ 0 & F_1(\delta t, E(t)) & 0 & \\ 0 & 0 & F_2(\delta t, E(t)) & \\ \vdots & & & \ddots \end{pmatrix} E(t) \tag{3}$$

$$= \hat{T}(\delta t, A, F)E(t) \tag{4}$$

Here, E(t) expressed as Equation (5) is referred to as E(t) as a traffic scene (corresponding to the initial traffic scene) at the time t and $\hat{T}(\delta t, A, F)$ is referred to as the time-flow operator in the traffic scene.

Formula 4

$$E(t) = {}^t(\xi_A(t), \xi_1(t), \xi_2(t), \ldots) \tag{5}$$

Based on the above-described assumptions, in order to obtain the past traffic scene E(t−δt) which is a result of temporal retracing-back as much as δt from the traffic scene E(t) at the time t, it is necessary to obtain an inverse operator of a time inversion operator, that is, a temporal retracing-back operator $\hat{T}^{-1}(\delta t, A, F)$. Hereinafter, a recursive method of obtaining the past traffic scene E(t−δt) which is a result of temporal retracing-back as much as δt will be described.

First, a state (a dynamic state) of a vehicle model that constitutes a traffic scene is assumed. An example of the dynamic state ξ of the vehicle model includes a position x, a speed v, an orientation φ, and an angular velocity ω of orientation. Those can be expressed as following Equation (6).

Formula 5

$$\xi = \begin{pmatrix} x \\ v \\ \phi \\ \omega \end{pmatrix} \tag{6}$$

Here, ξ(t−δt) can be approximated by expanding the equation as expressed in the following equations (7) to (9).

Formula 6

$$\xi(t-\delta t) = \xi(t) - \delta t \frac{d}{dt}\xi(t) + o(\delta t^2) \tag{7}$$

$$\sim \left[ 1 - \delta t \begin{pmatrix} 0 & v & 0 & 0 \\ 0 & 0 & 0 & 0 \\ 0 & 0 & 0 & \omega \\ 0 & 0 & 0 & 0 \end{pmatrix} \right] \xi(t) \tag{8}$$

$$= \hat{T}^{-1}(\delta t)\xi(t) \tag{9}$$

Here, $\hat{T}^{-1}(\delta t)$ is a linear temporal retracing-back operator.

The dynamic temporal retracing-back using this linear temporal retracing-back operator, which has no interaction between the autonomous driving vehicle model and the moving object model can be considered as Equation (10). In addition, the time-flow considering the interaction between the autonomous driving vehicle model and the moving object model including the effects of the autonomous driving algorithm can be considered as Equation (11). In Equation (11), e(t) represents a traffic scene (a restored traffic scene described later) when the time flows from the past traffic scene E(t−δt) to the time t of the initial traffic scene while considering the interaction between the autonomous driving vehicle model and the moving object model.

Formula 7

$$E_0(t-\delta t) = \hat{T}^{-1}(\delta t)E(t) \tag{10}$$

$$e(t) = \tau(\delta t, A, F)E_0(t-\delta t) \tag{11}$$

In this case, if the autonomous driving algorithm A to be evaluated does not try to make the autonomous driving vehicle model avoid the moving object model (if there is no interaction), it is expected that the following Equation (12) will be obtained.

Formula 8

$$e(t) = E(t) \tag{12}$$

On the other hand, if the autonomous driving algorithm A tries to make the autonomous driving vehicle model avoid the moving object model (if there is an interaction), it is expected that the following Equation (13) will be obtained.

Formula 9

$$e(t) \neq E(t) \tag{13}$$

However, even in this case, it is expected that E(t−δt) satisfying the Equation (14) below is present.

Formula 10

$$E(t) = \tau(\delta t, A, P)E(t-\delta t) \tag{14}$$

E(t−δt) in this case can be recursively obtained using following Equations (16) to (18) when the initial state is determined as illustrated in following Equation (15). Here, α is a free parameter that determines the efficiency of a convergence calculation.

Formula 11

$$E_0(t) = E(t) \tag{15}$$

$$e_{i+1}(t) = \tau(\delta t, A, P)\hat{T}^{-1}(\delta t)E_i(t) \tag{16}$$

$$\Delta E_{i+1}(t) = e_{i+1}(t) - E(t) \tag{17}$$

$$E_{i+1}(t) = E_i(t) - \alpha \Delta E_{i+1}(t) \tag{18}$$

Specifically, a past traffic scene candidate $E_{i+1}(t-\delta t)$ in Equation (19) when an error $\Delta E_{i+1}(t)$ at the time t is within a tolerance range set in advance (for example, equal to or smaller than a predetermined minute amount) can be the past traffic scene E(t−δt) obtained by the past traffic scene calculation unit 12.

Formula 12

$$E_i(t-\delta t) = \hat{T}^{-1}(\delta t)E_i(t) \tag{19}$$

The past traffic scene calculation unit 12 can calculate the past traffic scene E(t−δt) by performing the backward calculation described above.

The past traffic scene calculation unit 12 may set the past time point as a time point when both the state of the autonomous driving vehicle model and the state of the moving object model are the states of legal compliance state or the normal traveling state set in advance. Hereinafter, the legal compliance state and the normal traveling state will be collectively referred to as a legal compliance state unless it is necessary to distinguish between a legal compliance state and the normal traveling state. That is, the past traffic scene calculation unit 12 may repeat the calculation of the past traffic scene (past traffic scene candidate) for each temporal retracing by a predetermined time length from the time point of the initial traffic scene, and may obtain a past traffic scene candidate in which both the state of the autonomous driving vehicle model and the state of the moving object model are the legal compliance state within the allowable range of error $\Delta E_{i+1}(t)$ may be obtained as the past traffic scene, as the past traffic scene. The predetermined time is a time set in advance.

The legal compliance state means a state in which each moving object model (including the autonomous driving vehicle model) is in compliance with the traffic laws and regulations set in advance. Furthermore, it can be also conceivable to add a condition that each moving object model travels along the lane and travels in an area where the lanes are smoothly connected between each other at the intersection point.

The normal traveling state is a state in which each moving object model almost keeps the general traffic laws and regulations, and there is no possibility of a risky approach. A specific example of a normal traveling state is that each moving object model travels along the lane or travels in an area where the lanes are smoothly connected between each other at the intersection point, multiple moving object models are not traveling in parallel in the same lane or in the area described above, and the speed of each moving object model is roughly equal to or lower than the legal speed limit (limited speed). The legal speed limit roughly equal to or lower than the legal speed limit means a speed at which the risk avoidance can be expected even when the speed of another moving object model exceeds the legal speed limit in order to ensure the robustness of the performance, when the performance evaluation of the autonomous driving algorithm is performed. For example, the legal speed limit roughly equal to or lower than the legal speed limit is assumed to be a speed above the legal speed limit by 20% or by 15 km/h.

The legal compliance state and the normal traveling state are generally not in a mutually inclusive relationship. Specifically, if each moving object model exceeds the legal speed limit, the state is not a legal compliance state. On the other hand, if a bicycle and an automobile travel in the same lane at a speed equal to or lower than the legal speed limit, typically, when the automobile is trying to overtake the bicycle that travels on the left side of the same lane while traveling in the same lane, the state is a legal compliance state, but not a normal traveling state.

The determination that the state is a legal compliance state may be a determination whether or not the state is the legal compliance state in a narrow sense, may the determination whether or not the state is normal traveling state, may be a logical product of both, or may be a logical sum of both.

As an example, the legal compliance state of an autonomous driving vehicle model can be a state in which the autonomous driving vehicle model travels in the traveling lane along the direction of the traveling lane at a speed within the legal speed limit set for the traveling lane in which the autonomous driving vehicle model travels. Similarly, if the moving object model is another vehicle model, the legal compliance state can be a state in which the moving object travels in the lane along the traveling direction of the lane at a speed within the legal speed limit set in advance for the lane in which the moving object model travels. If the moving object model is a pedestrian, the legal compliance state can be a state in which the moving object model is moving through a pedestrian area set outside of the lane or a crosswalk area. In addition, the past traffic scene calculation unit 12 may calculate the past traffic scene while considering the road environment. One more possible past time point is a time point at which the state of the autonomous driving vehicle model deviates from the legal compliance state (or a time point backward from the above time point by a predetermined time). In this case, the autonomous driving algorithm will operate such that the situation does not fall into the initial traffic scene by keeping the law.

The comparison past traffic scene generation unit 13 generates a predetermined number of comparison past traffic scenes by minutely varying the past traffic scene. The minute variation of the past traffic scene means, for example, minutely varying the state (parameter) of the moving object model at the past time point or minutely varying the state (parameter) of the autonomous driving vehicle model at the past time point. The comparison past traffic scene generation unit 13 may minutely variation the state of both the autonomous driving vehicle model and the moving object model, or may minutely variation the state of only one of the autonomous driving vehicle model and the moving object model. The predetermined number can be a dimension number of the past traffic scene described later.

The minute variation of the state of the autonomous driving vehicle model at the past time point is performed by adding a minute amount to the parameters such as the position, speed, and the like included in the state of the autonomous driving vehicle model. A value set in advance can be used as the minute amount. The minute amount may be any random value close to 0 (for example, a random value smaller than 0.3). The minute variation may be performed not only by adding the minute amount, but also by subtracting the minute amount, by multiplying or dividing by a coefficient that can be the minute amount, or by using a calculation equation set in advance. The method of the minute variation is not limited to the method described above.

Here, an example of generating the comparison past traffic scene will be described. First, it is assumed that the past traffic scene $E(t-k\delta t)$ is represented by an M-dimensional vector. Here, k is an arbitrary coefficient. In this case, following Equations (20) to (22) using M-dimensional orthonormal vectors um (m=1, 2, ..., M) can be considered. Pm (m=1, 2, ..., M) represents the past traffic scene, $\delta p$ represents the minute amount close to 0, and $\Delta Pm$ represents a difference between the past traffic scene $E(t-k\delta t)$ and the comparison past traffic scene Pm.

Formula 13

$$P_m = E(t - k\delta t) + \delta p \cdot u_m \quad (20)$$

$$\Delta P_m = P_m - E(t - k\delta t) \quad (21)$$

$$= \delta p \cdot u_m \quad (22)$$

The comparison past traffic scene generation unit 13 can generate the M number of comparison past traffic scenes Pm set in advance using the Equations (20) to (22) described above.

The autonomous driving reflected scene calculation unit 14 calculates an autonomous driving reflected scene based on the past traffic scene, the road environment, and the autonomous driving algorithm. The autonomous driving reflected scene means a traffic scene in which a set time elapsed from the past traffic scene in a state that the autonomous driving is performed on the autonomous driving vehicle model by the autonomous driving algorithm. The set time is a time set in advance. As the set time, a minute time can be set. In addition, the set time may be a time for one step calculation of the past traffic scene calculation unit 12, or a time same as the time from the past time point to the time point of the initial traffic scene.

The moving object model also moves along the moving object algorithm set in advance. The moving object model does not necessarily need to move, but may be in a stationary state. The moving object model may move such that the state changes from the state of the moving object model in the past traffic scene to the initial state of the moving object model in the initial traffic scene. The moving object algorithm may change the behavior of the moving object model while taking the interaction with the autonomous driving vehicle model into consideration. In this case, the autonomous driving algorithm performs the autonomous driving of the autonomous driving vehicle model based on the influence of movement of the moving object model.

In addition, the autonomous driving reflected scene calculation unit 14 calculates a comparison autonomous driving reflected scene based on the comparison past traffic scene, the road environment, and the autonomous driving algorithm. The comparison autonomous driving reflected scene is a traffic scene after a set time elapsed in a state in which the autonomous driving is performed on the autonomous driving vehicle model by the autonomous driving algorithm from the comparison past traffic scene. The autonomous driving reflected scene calculation unit 14 calculates the comparison autonomous driving reflected scene for each comparison traffic scene. The autonomous driving reflected scene calculation unit 14 calculates the comparison autonomous driving reflected scene using the similar way of calculating the autonomous driving reflected scene calculation.

Hereinafter, an example of calculating the autonomous driving reflected scene and the comparison autonomous driving reflected scene will be described. The autonomous driving reflected scene calculation unit 14 can express the autonomous driving reflected scene and the comparison autonomous driving reflected scene that is obtainable from the past traffic scene E(t−kδt) and the comparison past traffic scene Pm for a set time δt after the time flows as much as the set time δt as the Equations (23) and (24) below. Here, Qm (m=1, 2, . . . , M) is the autonomous driving reflected scene or the comparison autonomous driving reflected scene.

Formula 14

$$Q_m(k-1, \Delta E) = \mathcal{T}(\delta t, A, P)P_m(k, \Delta E) \quad (23)$$

$$\Delta Q_m = \sum_{n=1}^{M} H_{mn}(k) \cdot \delta p \cdot u_n \quad (24)$$

Here, ΔQm represents an amount of variation of the past traffic scene E(t−kδt) described in Equations (21) and (22) per the time-flow of one step. This variation described as a linear transformation using the matrix H will be expressed as following equation.

Formula 15

$$(\Delta Q_1, \Delta Q_2, \ldots, \Delta Q_M) = H(\Delta P_1, \Delta P_2, \ldots, \Delta P_M) \quad (25)$$

$$H = (\Delta Q_1, \Delta Q_2, \ldots, \Delta Q_M)(\Delta P_1, \Delta P_2, \ldots, \Delta P_M)^{-1} \quad (26)$$

The stability of the time reversal of the past traffic scene can be evaluated by analyzing the properties of this linear transformation as described below. Specifically, the evaluation can be made based on whether or not the maximum eigenvalue of the matrix H is greater than 1. The time reversal can be evaluated as stable if the maximum eigenvalue is greater than 1, and unstable if it is equal to or smaller than 1.

The performance evaluation unit 15 evaluates the performance of the autonomous driving algorithm based on the past traffic scene. Specifically, the performance evaluation unit 15 evaluates the performance of the autonomous driving algorithm by evaluating whether the autonomous driving algorithm makes the situation stably converges toward the initial traffic scene from the past traffic scene and the comparison past traffic scene through the reflection of the autonomous driving algorithm, or unstably diverges, based on the past traffic scene, the autonomous driving reflected scene, the comparison past traffic scene, and the comparison autonomous driving reflected scene.

Figure 4A:
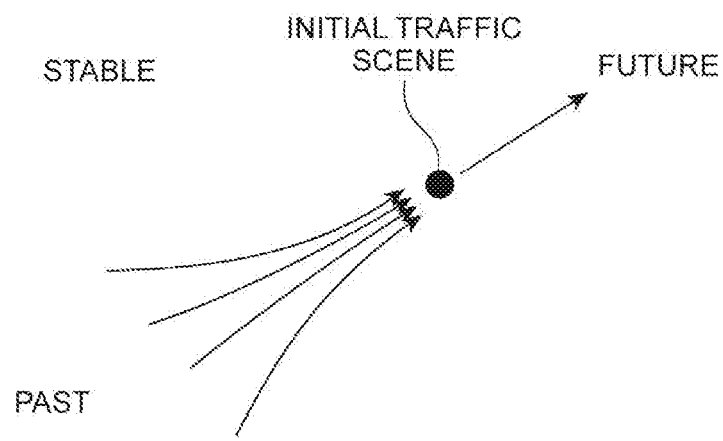
FIG. 4A is a diagram illustrating an image when a time-flow to the initial traffic scene is stable.

Here, FIG. 4A illustrates an image when the time-flow to the initial traffic scene is stable. In FIG. 4A, arrows from the past indicate a situation of the past traffic scene and the comparison past traffic scene when the time flows toward the future. The arrows toward the future from the initial traffic scene indicate the situation after the time flows from the initial traffic scene. The time-flow from the initial traffic scene will be described in a second embodiment.

As illustrated in FIG. 4A, if the time-flow to the initial traffic scene is stable, the arrows from the past converge toward the initial traffic scene. That is, the comparison past traffic scene obtained by minutely varying the past traffic scene also approaches the initial traffic scene as the time flows. This indicates that it is difficult to prevent the situation from reaching the initial traffic scene even if the autonomous driving by the autonomous driving algorithm is reflected in the autonomous driving vehicle model. In this case, it can be evaluated that the autonomous driving algorithm does not have a performance to prevent the situation from reaching the initial traffic scene from the past traffic scene and the comparison past traffic scene. Here, the description of the evaluation is made with an exemplary case where the initial traffic scene is a troublesome traffic scene.

Figure 4B:
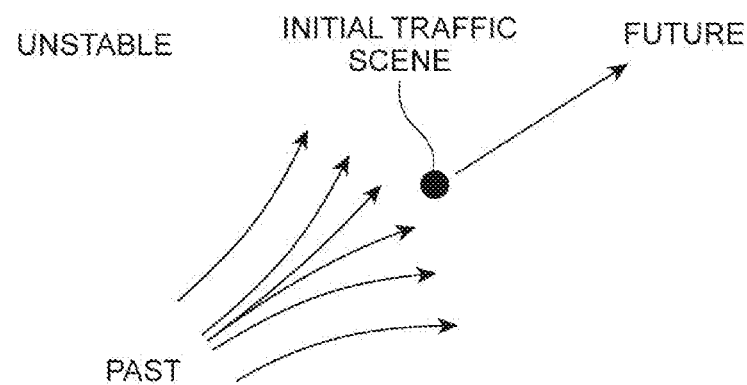
FIG. 4B is a diagram illustrating an image when a time-flow to the initial traffic scene is unstable.

FIG. 4B illustrates an image when the time-flow to the initial traffic scene is unstable. As illustrated in FIG. 4B, if the time-flow to the initial traffic scene is unstable, arrows from the past diverge without converging to the initial traffic scene. That is, the comparison past traffic scene becomes to be in a different states as the time flows without approaching the initial state in the initial traffic scene. This indicates that it is likely to prevent the situation from reaching the initial traffic scene from the past traffic scene and the comparison past traffic scenes if the autonomous driving by the autonomous driving algorithm is reflected in the autonomous driving vehicle model. In this case, it can be evaluated that the autonomous driving algorithm has a performance to prevent the situation from reaching the initial traffic scene. Even if a part of the arrows illustrated in FIG. 4B reaches the initial traffic scene, it can be referred to as unstable if the remaining arrows do not reach the initial traffic scene.

In order to make FIG. 4A and FIG. 4B easy to understand, the convergence of the arrows (stability) and the divergence of the arrows (unstable) toward the initial traffic scene was described, however, it is possible to evaluate the stability without the time-flow from the past time point to the initial traffic scene. That is, when focusing on a part of time period among the entire time period from the past time point to the time point of the initial traffic scene, if the arrows diverge without converging to the initial traffic scene, it can be considered that the divergence always occurs as the time flows even though any part of time period may be selected.

Figure 5:
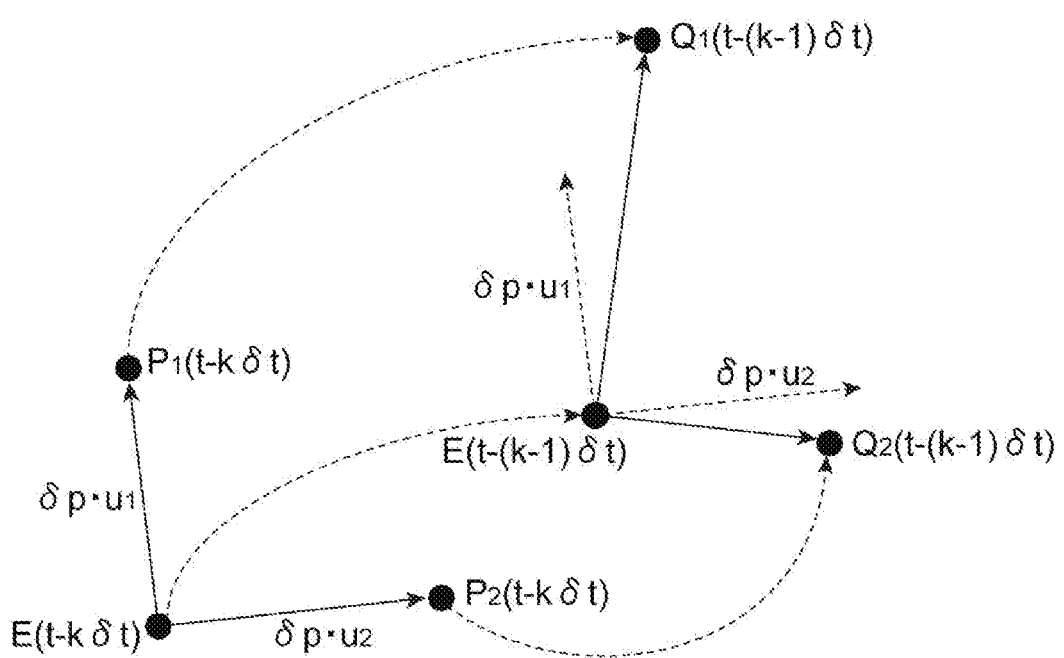
FIG. 5 is a diagram illustrating a specific exemplary case where a time-flow from a past traffic scene and a comparison past traffic scene are unstable.

FIG. 5 is a diagram illustrating a specific exemplary case where the time-flow from the past traffic scene and the comparison past traffic scene is unstable. FIG. 5 illustrates the past traffic scene $E(t-k\delta t)$, a first comparison past traffic scene $P_1(t-k\delta t)$, and a second comparison past traffic scene $P_2(t-k\delta t)$ at the past time point.

The first comparison past traffic scene $P_1(t-k\delta t)$ is a traffic scene obtained by minutely varying in past traffic scene $E(t-k\delta t)$ as much as $\delta p \cdot u_1$. Similarly, the second comparison past traffic scene $P_2(t-k\delta t)$ is a traffic scene obtained by minutely varying in past traffic scene $E(t-k\delta t)$ as much as $\delta p \cdot u_2$. The length of the arrows corresponds to the difference in the traffic scenes.

In addition, FIG. 5 illustrates the autonomous driving reflected scene $E(t-(k-1)\delta t)$, the first comparison autonomous driving reflected scene $Q_1(t-(k-1)\delta t)$, and the second comparison autonomous driving reflected scene $Q_2(t-(k-1)\delta t)$ at the time $t-k\delta t$ which is a time flowed from the past time point $t-(k-1)\delta t$ as much as Et. The set time does not necessarily need to be $\delta t$.

The first comparison autonomous driving reflected scene $Q_1(t-(k-1)\delta t)$ is a traffic scene obtained from the first comparison past traffic scene $P_1(t-k\delta t)$ after the time flows as much as $\delta t$ under the state of reflecting the autonomous driving by the autonomous driving algorithm. Similarly, the second comparison autonomous driving reflected scene $Q_2(t-(k-1)\delta t)$ is a traffic scene obtained from the second comparison past traffic scene $P_2(t-k\delta t)$ after the time flows as much as $\delta t$ under the state of reflecting the autonomous driving by the autonomous driving algorithm.

In the situation in FIG. 5, a difference between the autonomous driving reflected scene $E(t-(k-1)\delta t)$ and the first comparison autonomous driving reflected scene $Q_1(t-(k-1)\delta t)$ after the time flows is greater than $\delta p \cdot u_1$ which is a difference between the first comparison past traffic scene $E(t-k\delta t)$ and the first comparison past traffic scene $P_1(t-k\delta t)$. In this case, since the difference between the autonomous driving reflected scene $E(t-(k-1)\delta t)$ and the first comparison autonomous driving reflected scene $Q_1(t-(k-1)\delta t)$ increases as the time flows, it can be evaluated to be unstably diverges without converging to the initial traffic scene. In other words, the autonomous driving algorithm can be evaluated to have a performance to prevent the situation from reaching the initial traffic scene.

In this way, the performance evaluation unit 15 can evaluate the performance of the autonomous driving algorithm based on the past traffic scene, the autonomous driving reflected scene, the comparison past traffic scene, and the comparison autonomous driving reflected scene.

Specifically, the performance evaluation unit 15 calculates the transformation matrix $H(k)$ in Equation (26) described above and can evaluate the stability of the autonomous driving algorithm using the transformation matrix $H(k)$. If the maximum eigenvalue $\lambda_{max}(k)$ among the eigenvalues of the transformation matrix $H(k)$ is greater than 1, even when the two traffic scenes (for example, the past traffic scene and the comparison past traffic scene) are very similar, it is known that the difference between traffic scenes becomes greater (becomes unstable) as the time flows. Furthermore, it is also known to be a major element of time-flow.

If the temporal backward calculation is possible, the transformation matrix $H(k)$ and the maximum eigenvalue $\lambda_{max}(k)$ of the time-flow can be calculated along the time axis $E(t-n\delta t) \rightarrow E(t-(n-1)\delta t) \rightarrow E(t-(n-2)\delta t) \rightarrow \ldots \rightarrow E(t-\delta t) \rightarrow E(t)$.

The column $\lambda_{max}(k)$ and k of the maximum eigenvalues obtained is this way is expressed in following Equation (27).

Formula 16

$$\lambda_{max}(k), k=n,(n-1), \ldots ,2,1 \qquad (27)$$

Equation (27) described above represents the stability of the traffic scene along time-flow. Specifically, if $\lambda_{max}(k)$ is greater than 1, the difference between the two traffic scenes (for example, the autonomous driving reflected scene and the comparison autonomous driving reflected scene) becomes large the time flows as is apparent from the calculations up to now. That is, the situation becomes unstable. In this case, it can be understood that the product of $\lambda_{max}(k)$ expressed in following Equation (28) increases geometrically.

Formula 17

$$\Lambda_{max} = \prod_{k=1}^{n} \lambda_{max}(k) \qquad (28)$$

That is, even if a past traffic scene that can reach the initial traffic scene $E(t)$ is present, if there is a minute variation in the past traffic scene as a matter of fact (if there is a slight difference), it means that the past traffic scene does not reach the initial traffic scene $E(t)$. In other words, it can be evaluated that, in the autonomous driving algorithm, the situation does not fall into the initial traffic scene $E(t)$, more precisely, the probability of falling into the initial traffic scene $E(t)$ asymptotically approaches zero at the infinite time of $\delta t=0$.

On the contrary, if $\lambda_{max}(k)$ is smaller than 1, the difference between the two traffic scenes after the time-flow rapidly approaches zero as the time flows, and thus, it can be understood that the situation becomes stable as the time flows. When $\lambda_{max}(k)=1$, the situation can be regarded as stable.

In this way, the performance evaluation unit 15 can evaluate whether the autonomous driving algorithm makes the situation stably converge or unstably diverge to the initial traffic scene. The performance evaluation unit 15 can evaluate that the autonomous driving algorithm has the performance to prevent the situation from reaching the initial traffic scene when the autonomous driving algorithm makes the situation unstably diverge to the initial traffic scene.

Figure 6:
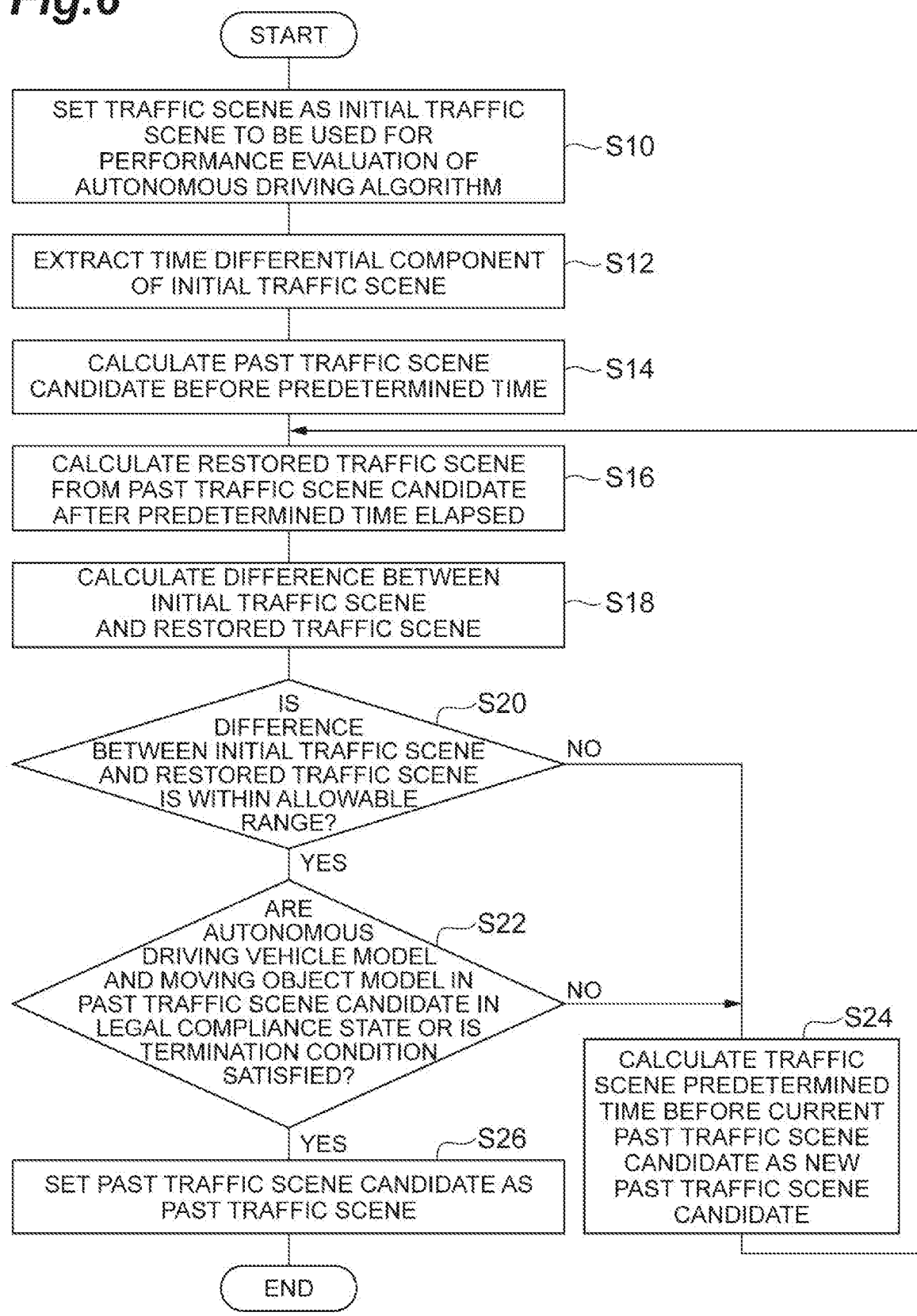
FIG. 6 is a flowchart illustrating initial traffic scene setting processing and backward calculation processing.

Autonomous Driving Evaluation Method Using the Autonomous Driving Evaluation Apparatus in the First Embodiment Hereinafter, the autonomous driving evaluation method using the autonomous driving evaluation apparatus 100 in the first embodiment will be described. FIG. 6 is a flowchart illustrating initial traffic scene setting processing and backward calculation processing.

As illustrated in FIG. 6, the autonomous driving evaluation apparatus 100 sets an initial traffic scene using the initial traffic scene setting unit 11 as S10 (initial traffic scene setting step). The initial traffic scene setting unit 11 sets the traffic scene as an initial traffic scene to be used for the performance evaluation of the autonomous driving algorithm.

In S12, the autonomous driving evaluation apparatus 100 extracts the time differential component of the initial traffic scene (such as the speed of the autonomous driving vehicle model and the speed of the moving object model) using the past traffic scene calculation unit 12.

In S14, the autonomous driving evaluation apparatus 100 calculates a past traffic scene candidate before a predetermined time using the past traffic scene calculation unit 12. The past traffic scene calculation unit 12 calculates the past traffic scene candidate temporally back traced from the initial state of the autonomous driving vehicle model and the initial state of the moving object model based on the time differential component of the initial traffic scene. The past traffic scene calculation unit 12 calculates the past traffic scene candidate using, for example, Equation (10) described above.

In S16, the autonomous driving evaluation apparatus 100 calculates the restored traffic scene using the past traffic scene calculation unit 12. The past traffic scene calculation unit 12 calculates the restored traffic scene from the past traffic scene candidate by making the time flow considering the interaction between the autonomous driving vehicle model and the moving object model including the effects of the autonomous driving algorithm. The past traffic scene calculation unit 12 calculates the restored traffic scene using, for example, Equation (11) described above.

In S18, the autonomous driving evaluation apparatus 100 calculates the difference between the initial traffic scene and the restored traffic scene using the past traffic scene calculation unit 12. The difference between the initial traffic scene and the restored traffic scene corresponds to Equation (17) described above.

In S20, the autonomous driving evaluation apparatus 100 determines whether or not the difference between the initial traffic scene and the restored traffic scene is within an allowable range using the past traffic scene calculation unit 12. The allowable range is a range set in advance. The allowable range includes, for example, an allowable speed threshold value, an allowable distance threshold value, and an allowable orientation threshold value.

The past traffic scene calculation unit 12 determines that the difference between the initial traffic scene and the restored traffic scene is within the allowable range if, for example, only the state of the autonomous driving vehicle model has the difference in the initial traffic scene candidate and the restored traffic scene, and when absolute values of the difference of the speed, the difference of the position (distance), and the difference of the orientation of the autonomous driving vehicle model in the initial traffic scene candidate and the restored traffic scene are respectively equal to or smaller than the allowable speed threshold value, the allowable distance threshold value, and the allowable direction threshold value. Even in a case where only the moving object model has the difference, it is possible to similarly perform the determination using the threshold values. Elements other than the speed, the position, and the orientation may be used for the above-described determination.

If the time-flow from the past traffic scene is unstable, in some cases, the difference between the initial traffic scene candidate and restored traffic scene obtained from the past traffic scene by the simulation does not converge (diverges), and thus, the termination condition described above may be inappropriate. In such a case, using the fact that the error for each step described in Equation (17) is equal to or less than a predetermined value, and the fact that the back traced time $k\delta t$ become a predetermined time, the termination condition can be assumed to be satisfied.

If the autonomous driving evaluation apparatus 100 determines that the difference between the initial traffic scene and the restored traffic scene is within the allowable range (YES in S20), the process proceeds to S24. If it is determined that the difference between the initial traffic scene and the restored traffic scene is not within the allowable range (NO in S20), the autonomous driving evaluation apparatus 100 shifts the process to S26.

In S22, the autonomous driving evaluation apparatus 100 determines whether the autonomous driving vehicle model and the moving object model in the past traffic scene candidate are in the legal compliance state or the termination condition is satisfied using the past traffic scene calculation unit 12. The fact that the autonomous driving vehicle model and the moving object model in the past traffic scene candidate are in the legal compliance states means a state in which, for example, both the autonomous driving vehicle model and the moving object model are traveling in the lane along the traveling direction of the lane at the speed within the range of the legal speed limit set for each lane in which each model travels.

The termination condition is a condition set in advance for determining whether or not to terminate the calculation of the past traffic scene. The past traffic scene calculation unit 12 may determine that the termination condition is satisfied if the temporal retracing-back is performed for a certain period of time (for example, 10 seconds). The past traffic scene calculation unit 12 may determine that the termination condition is satisfied if the autonomous driving vehicle model in the past traffic scene candidate is in a legal violation state. Alternatively, the past traffic scene calculation unit 12 may determine that the termination condition is satisfied at a time point when the temporal retracing-back is performed as much as a time set in advance after the autonomous driving vehicle model in the past traffic scene candidate becomes to be in the legal violation state. The legal violation state can be states other than the legal compliance state.

The legal violation state may include a state in which the speed of the autonomous driving vehicle model exceeds the legal speed limit in the traveling lane. The legal violation state may include a state in which the autonomous driving vehicle model deviates from traveling lane without a reason such as a lane change. The legal violation state may include a state in which the autonomous driving vehicle model is traveling in a direction substantially opposite to the traveling direction of the traveling lane. In addition, if the normal traveling state is used for the determination, a state in which a plurality of moving object models (autonomous driving vehicle models may be included) are traveling in the same lane, may be included.

If it is not determined that the autonomous driving vehicle model and the moving object model in the past traffic scene candidate are in the legal compliance states and it is not determined that the termination condition is satisfied (NO in S22), the autonomous driving evaluation apparatus 100 shifts the process to S24. If it is determined that the autonomous driving vehicle model and the moving object model in the past traffic scene candidate are in the legal compliance state or the termination condition is satisfied (YES in S22), the autonomous driving evaluation apparatus 100 shifts the process to S26.

In S24, the autonomous driving evaluation apparatus 100 calculates the traffic scene a predetermined time before the current past traffic scene candidate as a new past traffic scene candidate using the past traffic scene calculation unit 12. Subsequently, the autonomous driving evaluation apparatus 100 repeats the processing items from S16 for the new past traffic scene candidate.

In S26, the autonomous driving evaluation apparatus 100 sets the past traffic scene candidate as a past traffic scene using the past traffic scene calculation unit 12. Subsequently, the autonomous driving evaluation apparatus 100 starts the performance evaluation processing. S12 to S26 illustrated in FIG. 6 constitute a past traffic scene calculation step for calculating the past traffic scene.

In the past traffic scene obtained as described above, if the autonomous driving vehicle model is not in the legal compliance state, since it is not consistent with the fact that the autonomous driving vehicle model is designed to keep the legal compliance state, it can be evaluated that the autonomous driving vehicle model will not fall into the initial traffic scene. Even in a case where a deviation from the legal compliance state is partially recognized in order to assure the safety of the autonomous driving vehicle model, it is evaluated that a warning can be issued to a driver of the autonomous driving vehicle model before falling into the initial traffic scene by detecting the partial legal violation state (or non-normal traveling state). On the other hand, in the obtained past traffic scene, if the autonomous driving vehicle model is in the legal compliance state, the evaluation is performed based on the mechanical stability.

Figure 7:
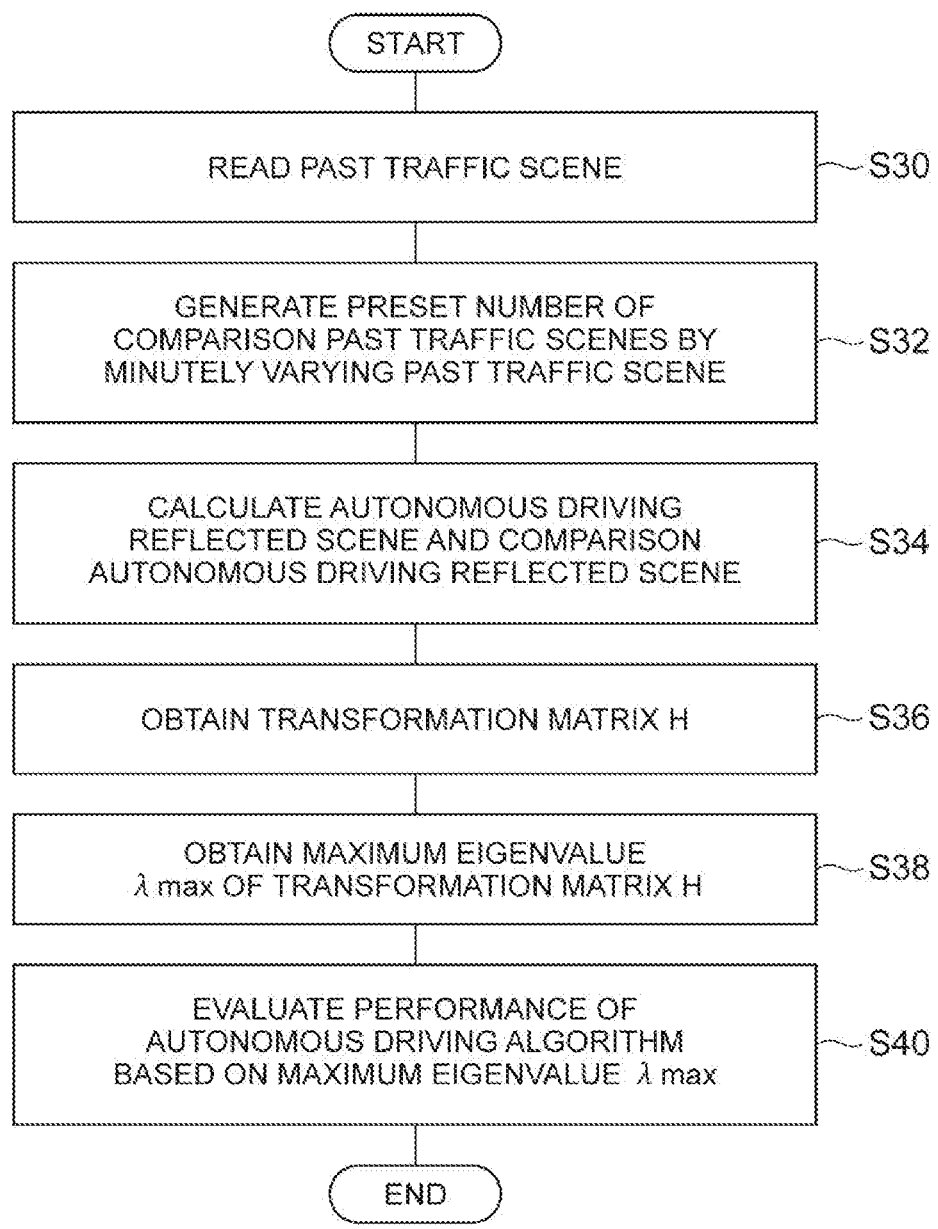
FIG. 7 is a flowchart illustrating performance evaluation processing based on a dynamic stability.

FIG. 7 is a flowchart illustrating performance evaluation processing based on the dynamic stability. As illustrated in FIG. 7, the autonomous driving evaluation apparatus 100 reads the past traffic scene calculated by the past traffic scene calculation unit 12 as S30.

In S32, the autonomous driving evaluation apparatus 100 generates a comparison past traffic scene using the comparison past traffic scene generation unit 13 (a comparison past traffic scene generation step). The comparison past traffic scene generation unit 13 generates a preset number of comparison past traffic scenes by minutely varying the past traffic scene.

In S34, the autonomous driving evaluation apparatus 100 calculates the autonomous driving reflected scene and the comparison autonomous driving reflected scene using the autonomous driving reflected scene calculation unit 14 (an autonomous driving reflected scene calculation step). The autonomous driving reflected scene calculation unit 14 calculates the autonomous driving reflected scene after a preset time elapsed in a state in which the autonomous driving is performed on the autonomous driving vehicle model by the autonomous driving algorithm from the past traffic scene based on the past traffic scene and autonomous driving algorithm. In addition, the autonomous driving reflected scene calculation unit 14 calculates the comparison autonomous driving reflected scene after a preset time elapsed in a state in which the autonomous driving is performed on the autonomous driving vehicle model by the autonomous driving algorithm from the comparison past traffic scene based on the comparison past traffic scene and the autonomous driving algorithm.

In S36, the autonomous driving evaluation apparatus 100 calculates the transformation matrix H using the performance evaluation unit 15. The performance evaluation unit 15 calculates the transformation matrix H illustrated in Equation (26) based on the past traffic scene, the comparison past traffic scene, the autonomous driving reflected scene, and the comparison autonomous driving reflected scene.

In S38, the autonomous driving evaluation apparatus 100 obtains the maximum eigenvalue λ max of the transformation matrix H using the performance evaluation unit 15. The performance evaluation unit 15 can obtain the maximum eigenvalue λmax through the calculation along the along the time axis $E(t-n\delta t) \rightarrow E(t-(n-1)\delta t) \rightarrow E(t-(n-2)\delta t) \rightarrow \ldots \rightarrow E(t-\delta t) \rightarrow E(t)$.

In S40, the autonomous driving evaluation apparatus 100 evaluates the performance of the autonomous driving algorithm using the performance evaluation unit 15. The performance evaluation unit 15 evaluates the performance of the autonomous driving algorithm based on the maximum eigenvalue λmax. S36, S38, and S40 illustrated in FIG. 7 constitute a performance evaluation step for evaluating the performance of the autonomous driving algorithm. As described above, in this result of evaluation, if the movement of the autonomous driving vehicle is dynamically unstable, it is evaluated that the vehicle does not fall into the initial traffic scene, and if the movement of the autonomous driving vehicle is stable, it is evaluated that the vehicle may fall into the initial traffic scene.

Operational Effects of the Autonomous Driving Evaluation Apparatus in the First Embodiment According to the autonomous driving evaluation apparatus 100 in the first embodiment described above, the past traffic scene which is back traced from the initial traffic scene is calculated and the performance of the autonomous driving algorithm is evaluated based on the past traffic scene, therefore, it is possible to appropriately evaluate the autonomous driving algorithm compared to a case where the past traffic scene is not taken into consideration.

In addition, according to the autonomous driving evaluation apparatus 100, the autonomous driving reflected scene is calculated from the past traffic scene and the comparison past traffic scene is calculated from a plurality of comparison past traffic scene at the past time point, and then, the autonomous driving algorithm is evaluated based on the autonomous driving reflected scene and the comparison past traffic scene. Therefore, according to the autonomous driving evaluation apparatus 100, by reflecting the autonomous driving algorithm, it becomes possible to recognize the tendency of stable convergence or unstable divergence toward the initial traffic scene from the past traffic scene and the comparison past traffic scene, and thus, it is possible to appropriately evaluate the performance of the autonomous driving algorithm so as not to make the situation reach the initial traffic scene.

Furthermore, according to the autonomous driving evaluation apparatus 100, since the past traffic scene is calculated at the time when both the state of the autonomous driving vehicle model and the state of the moving object model become the preset legal compliance state as the past time point by temporally back tracing the time by a predetermined time length from the time point of the initial traffic scene, adoption of the past traffic scene of the legal violation state which is inappropriate for the precondition of the evaluation of the autonomous driving algorithm can be avoided, and thus, it is possible to appropriately evaluate the autonomous driving algorithm.

Second Embodiment

Figure 8:
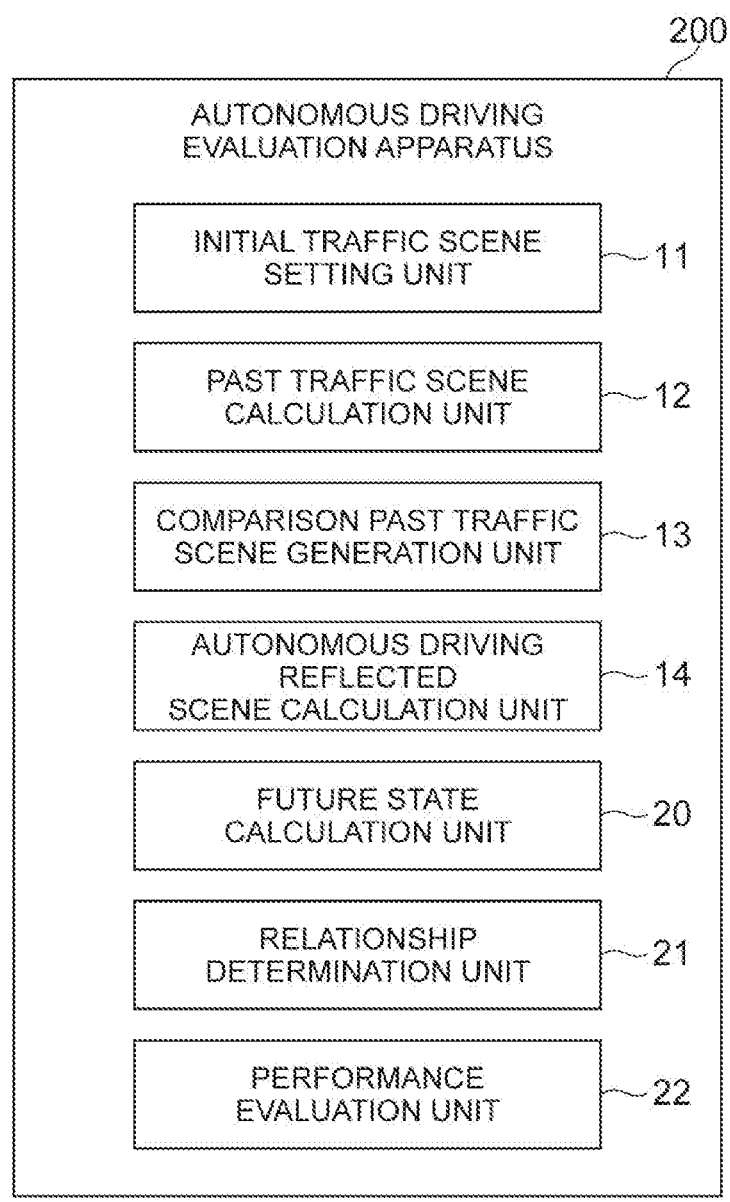
FIG. 8 is a block diagram illustrating an autonomous driving evaluation apparatus in a second embodiment.

FIG. 8 is a block diagram illustrating an autonomous driving evaluation apparatus in a second embodiment. An autonomous driving evaluation apparatus 200 illustrated in FIG. 8 differs from the autonomous driving evaluation apparatus 100 in the first embodiment only in a point that the evaluation of the autonomous driving algorithm is performed by a forward calculation.

In the autonomous driving evaluation apparatus 200, the autonomous driving algorithm is evaluated that the situation stably converge to the initial traffic scene, the performance evaluation of the autonomous driving algorithm is performed by evaluating the behavior of the autonomous driving algorithm when the time flows from the initial traffic scene. The autonomous driving evaluation apparatus 200 may evaluate the behavior of the autonomous driving algorithm when the time flows from the initial traffic scene regardless of the stability evaluation described in the first embodiment.

Configuration of the Autonomous Driving Evaluation Apparatus in the Second Embodiment As illustrated in FIG. 8, the autonomous driving evaluation apparatus 200 in the second embodiment includes a future state calculation unit 20 and a relationship determination unit 21 compared to the first embodiment.

The future state calculation unit 20 calculates a future state of the autonomous driving vehicle model when the autonomous driving is performed using the autonomous driving algorithm from the time of the initial traffic scene and a future state of the moving object model that performs a preset movement from the time point of the initial traffic scene based on the initial state of the autonomous driving vehicle model, the initial state of the moving object model, and the road environment. The future state calculation unit 20 performs a forward calculation toward the future in contrast to the backward calculation.

The future state of the autonomous driving vehicle model is a state of the autonomous driving vehicle model after the time flows from the time point of the initial traffic scene. The future state of the moving object model is a state of the moving object model after the time flows from the time point of the initial traffic scene. The moving object model moves along the moving object algorithm set in advance. The moving object model may be in a stationary state without moving if the initial state is a stationary state.

The future state calculation unit 20 calculates the future state of the autonomous driving vehicle model and the future state of the moving object model from the initial traffic scene using a method similar to the method of calculating the autonomous driving reflected scene from the past traffic scene. The future state calculation unit 20 may calculate the future state of the autonomous driving vehicle model and the future state of the moving object model from the initial traffic scene using a well-known method.

For example, the future state calculation unit 20 may repeat the calculation of the future state of the autonomous driving vehicle model and the future state of the moving object model for each time-flow by a predetermined time length from the time point of the initial traffic scene. The future state calculation unit 20 terminates the calculation of the future state if the relationship determination unit 21 described later determines that the autonomous driving vehicle model and the moving object model are in a low evaluation relationship set in advance or if it is determined that the termination condition is satisfied.

The relationship determination unit 21 determines whether or not the autonomous driving vehicle model and the moving object model are in a low evaluation relationship based on the future state of the autonomous driving vehicle model and the future state of the moving object model. The low evaluation relationship is a relationship between the autonomous driving vehicle model and the moving object model set in advance. The low evaluation relationship includes, for example, a relationship in which the autonomous driving vehicle model and the moving object model will collide with each other when traveling straight ahead as illustrated in FIG. 3.

The low evaluation relationship is not limited to a relationship in which the autonomous driving vehicle model and the moving object model will collide with each other. The low evaluation relationship may include a relationship in which the autonomous driving vehicle model becomes to be in a legal violation state in order to avoid the collision with the moving object model. The low evaluation relationship may include a relationship in which both the autonomous driving vehicle model and the moving object model are in the legal violation state.

The relationship determination unit 21 determines whether or not a termination condition set in advance is satisfied. The termination condition is a condition set in advance for determining whether or not to terminate the calculation of the future state using the future state calculation unit 20. If the future state calculation unit 20 calculates the future state up to a certain time set in advance (for example, after 30 seconds) from the time point of the initial traffic scene, the relationship determination unit 21 determines that the termination condition is satisfied. The relationship determination unit 21 may determine that the termination condition is satisfied when the future state of the autonomous driving vehicle model and the future state of the moving object model start to stably widen the distance therebetween. The case where the future state of the autonomous driving vehicle model and the future state of the moving object model start to stably widen the distance therebetween means, for example, a case where the separated distance per a certain time is equal to or greater than a threshold value.

The performance evaluation unit 22 evaluates the performance of the autonomous driving algorithm based on the result of determination performed by the relationship determination unit 21. If it is determined by the relationship determination unit 21 that the autonomous driving vehicle model and the moving object model are in a low evaluation relation, the performance evaluation unit 22 can evaluate that the autonomous driving algorithm has no performance to avoid the low evaluation relationship between the autonomous driving vehicle model and the moving object model when the two models reach the initial traffic scene. If it is determined by the relationship determination unit 21 that the autonomous driving vehicle model and the moving object model are not in a low evaluation relation, the performance evaluation unit 22 can evaluate that the autonomous driving algorithm has a performance to avoid the low evaluation relationship between the autonomous driving vehicle model and the moving object model even though the two models reach the initial traffic scene.

FIG. 9 is a table illustrating an example of the performance evaluation in the second embodiment. FIG. 9 illustrates an example of the performance evaluation of the autonomous driving algorithm in a case where a troublesome initial traffic scene (refer to FIG. 3) is set as scene to be evaluated.

As illustrated in FIG. 9, if is evaluated by the backward calculation described in the first embodiment that the autonomous driving algorithm makes the situation unstably diverge to the initial traffic scene, the performance evaluation unit 22 evaluates (OK evaluation) that there is no problem in the performance of the autonomous driving algorithm regardless of the compliance with the laws and regulations of the autonomous driving vehicle model and the moving object model in the past traffic scene and the result of forward calculation from the initial traffic scene in the second embodiment. In this case, even in the autonomous driving algorithm in which it is determined that the autonomous driving vehicle model and the moving object model are in the low evaluation relationship when forward calculation from initial traffic scene is performed, if the algorithm has the performance to make the situation prevent the situation from reaching the initial traffic scene from the beginning, the two models are not in the low evaluation relation. Therefore, the performance evaluation unit 22 can evaluate that there is no problem in the performance of the autonomous driving algorithm.

In addition, in a case where the autonomous driving algorithm is evaluated to make the situation stably converge to the initial traffic scene by the backward calculation, when it is determined that the autonomous driving vehicle model and the moving object model in the past traffic scene are in the legal compliance states and it is determined by the forward calculation that the autonomous driving vehicle model and the moving object model are not in the low evaluation relation, the performance evaluation unit 22 evaluates (OK evaluation) that there is no problem in the performance of the autonomous driving algorithm.

On the other hand, in a case where the autonomous driving algorithm is evaluated to make the situation stably converge to the initial traffic scene by the backward calculation, when it is determined that the autonomous driving vehicle model and the moving object model in the past traffic scene are in the legal compliance states and the moving object model in the past traffic scene are in the legal compliance states and it is determined by the forward calculation that the autonomous driving vehicle model and the moving object model are in the low evaluation relation, the performance evaluation unit 22 evaluates (NG evaluation) that there is a problem in the performance of the autonomous driving algorithm. In this case, by reflecting the autonomous driving using the autonomous driving algorithm, the autonomous driving vehicle model and the moving object model become to be in the low evaluation relationship from the past traffic scene which is the legal compliance state via the initial traffic scene. Therefore, the performance evaluation unit 22 can evaluate that there is a problem in the performance of the autonomous driving algorithm.

In a case where the autonomous driving algorithm is evaluated to make the situation stably converge to the initial traffic scene by the backward calculation, if the autonomous driving vehicle model in the past traffic scene is in the legal violation state, the performance evaluation unit 22 evaluates (OK evaluation) that there is no problem in the performance of the autonomous driving algorithm. In this case, since it can be considered that the autonomous driving algorithm does not make the situation reach the initial traffic scene unless there is an abnormal situation that the autonomous driving vehicle model becomes to be in a legal violation state at the past time point, the performance evaluation unit 22 evaluates that there is no problem in the autonomous driving algorithm.

Autonomous Driving Evaluation Method Using the Autonomous Driving Evaluation Apparatus in the Second Embodiment Hereinafter, the autonomous driving evaluation method using the autonomous driving evaluation apparatus 200 in the second embodiment will be described. Here, the forward calculation processing will be described. The forward calculation processing also includes the performance evaluation processing using the result of forward calculation. The backward calculation processing is the same as that in the first embodiment, and thus, the description thereof will be omitted.

FIG. 10 is a flowchart illustrating the forward calculation processing. As illustrated in FIG. 10, the autonomous driving evaluation apparatus 200 sets an initial traffic scene using the initial traffic scene setting unit 11 as S50 (initial traffic scene setting step). The initial traffic scene setting unit 11 sets the traffic scene as an initial traffic scene to be used for the performance evaluation of the autonomous driving algorithm. S50 is the same processing as S10 illustrated in FIG. 5, and S50 can be omitted if the initial traffic scene has already been set. Either the backward calculation and or the forward calculation may be executed first, and the forward calculation may be performed only when the situation is evaluated as stable by backward calculation.

In S52, the autonomous driving evaluation apparatus 200 calculates the future state of the autonomous driving vehicle model and the future state of the moving object model when the autonomous driving is performed using the autonomous driving algorithm from a time point of the initial traffic scene up to a predetermined elapsed time using the future state calculation unit 20 (future state calculation step). The future state calculation unit 20 calculates the future state of the autonomous driving vehicle model and the future state of the moving object model from the initial traffic scene using the same method as the method of calculating the autonomous driving reflected scene from the past traffic scene.

In S54, the autonomous driving evaluation apparatus 200 determines whether the autonomous driving vehicle model and the moving object model are in the low evaluation relationship or the termination condition is satisfied (relationship determination step) using the relationship determination unit 21. The relationship determination unit 21 performs the above-described determination based on the future state of the autonomous driving vehicle model and the future state of the moving object model. If it is not determined that the autonomous driving vehicle model and the moving object model are in the low evaluation relationship and it is not determined that the termination condition is satisfied (NO in S54), the autonomous driving evaluation apparatus 200 shifts the process to S56. On the other hand, if it is determined that the autonomous driving vehicle model and the moving object model are in the low evaluation relationship or it is determined that the termination condition is satisfied (YES in S54), the autonomous driving evaluation apparatus 200 shifts the process to S58.

In S56, the autonomous driving evaluation apparatus 200 calculates the future state of the autonomous driving vehicle model and the future state of the moving object model when the autonomous driving is performed using the autonomous driving algorithm up to the predetermined time elapsed again using the future state calculation unit 20. Thereafter, the autonomous driving evaluation apparatus 200 returns the process to S54 and repeats the process.

In S58, the autonomous driving evaluation apparatus 200 evaluates the performance of the autonomous driving algorithm using the performance evaluation unit 22. The performance evaluation unit 22 evaluates the performance of the autonomous driving algorithm based on the result of determination performed by the relationship determination unit 21 (result of determination in S54). The performance evaluation unit 22 determines whether or not the autonomous driving vehicle model and the moving object model are in the low evaluation relationship when the forward calculation is performed from the initial traffic scene while reflecting the autonomous driving by the autonomous driving algorithm, based on the result of determination performed by the relationship determination unit 21. If the backward calculation processing has been completed in the first embodiment, the performance evaluation unit 22 may evaluate the performance of the autonomous driving algorithm based on the result of backward calculation as illustrated in FIG. 9.

Operational Effects of the Autonomous Driving Evaluation Apparatus in the Second Embodiment According to the autonomous driving evaluation apparatus 200 in the second embodiment described above, by calculating the future state of the autonomous driving vehicle model and the future state of the moving object model when the autonomous driving is performed using the autonomous driving algorithm from the time point of the initial traffic scene, it is possible to determine whether or not the two models are in the low evaluation relationship set in advance when the time is elapsed from the initial traffic scene while reflecting the autonomous driving algorithm. Therefore, it is possible to appropriately evaluate the autonomous driving algorithm.

As described above, the preferred embodiments of the present disclosure have been described, however, the present disclosure is not limited to the above-described embodiments. The present disclosure can be implemented in various forms including various modifications and improvements based on the knowledge of those skilled in the art in addition to the embodiments described above.

The initial traffic scene is not limited to the traffic scene described above.

The initial traffic scene may be a traffic scene in which another vehicle model (a moving object model) approaches an intersection of the traveling lane of the autonomous driving vehicle model at the intersection point. The initial traffic scene may be a traffic scene in which a pedestrian mode (a moving object model) enters a parking space where an autonomous driving vehicle model is trying to park in a parking lot. The initial traffic scene may be a traffic scene in which a pedestrian model (a moving object model) walks across in front of the autonomous driving vehicle model when the autonomous driving vehicle model tries to turn right or left within the intersection. The initial traffic scene may be a traffic scene in which a bicycle model traveling on the right rear of the autonomous driving vehicle model travels straight ahead when the autonomous driving vehicle model is trying to turn right.

The past time point, which is the time point of the past traffic scene, may be fixed to a time point a predetermined time before the initial traffic scene. In other words, in one calculation, the past traffic scene calculation unit 12 may calculate a traffic scene at a time point a certain time before the initial traffic scene as a past traffic scene.

In the evaluation of stability, the evaluation is performed while a part of time period is focused among the entire time period from the past time point to the time point of the initial traffic scene, however, the entire time period may be used not a part of time period. That is, the autonomous driving reflected scene calculation unit 14 may calculate the autonomous driving reflected scene in a state in which the time elapses from the past time point of the past traffic scene to the time point of the initial traffic scene under a state in which the autonomous driving is performed on the autonomous driving vehicle model using the autonomous driving algorithm. Similarly, the autonomous driving reflected scene calculation unit 14 may calculate the comparison autonomous driving reflected scene under a state in which the time elapses from the past time point to the time point of the initial traffic scene.

The number of comparison past traffic scenes may be a number equal to or greater than two, which is smaller than a dimension of the past traffic scene.

What is claimed is:

1. An autonomous driving evaluation apparatus for evaluating an autonomous driving by a simulation, the apparatus comprising:
   a memory that stores a program; and
   a processor configured to execute the stored program so as to:
   set an initial traffic scene, in which an autonomous driving vehicle model and a moving object model are involved, by setting: (i) an initial state of the autonomous driving vehicle model on which an autonomous driving is performed, (ii) an initial state of the moving object model, and (iii) a road environment in which the autonomous driving vehicle model and the moving object model are disposed;
   calculate a past traffic scene candidate, in which the autonomous driving vehicle model and the moving object model are involved, at a past time point back traced from a time point of the initial traffic scene based on the initial traffic scene, wherein the past traffic scene candidate is calculated by repeatedly calculating the states of the autonomous driving vehicle model and the states of the moving object model at the time points that are time points back traced from the time point of the initial traffic scene by a predetermined time length;
   determine whether both the state of the autonomous driving vehicle model and the state of the moving object model are in a legal compliance state which was set in advance;
   based upon both the state of the autonomous driving vehicle model and the state of the moving object model being in the legal compliance state, set the past traffic scene candidate as a past traffic scene; and
   evaluate a performance of the autonomous driving based on the past traffic scene.

2. The autonomous driving evaluation apparatus according to claim 1, wherein the process is further configured to:
   generate a preset number of comparison past traffic scenes at the past time point by minutely varying the past traffic scene; and
   respectively calculate an autonomous driving reflected scene after a time set in advance elapses from the past traffic scene under a state in which the autonomous driving is performed on the autonomous driving vehicle model, and calculate a comparison autonomous driving reflected scene after a time set in advance elapses from the comparison past traffic scene under a state in which the autonomous driving is performed on the autonomous driving vehicle model,
   wherein the performance of the autonomous driving is evaluated based on the initial traffic scene, the past traffic scene, the comparison past traffic scene, the autonomous driving reflected scene, and the comparison autonomous driving reflected scene.

3. The autonomous driving evaluation apparatus according to claim 2, wherein the processor is further configured to:
calculate a future state of the autonomous driving vehicle model when the autonomous driving is performed from the time point of the initial traffic scene and a future state of the moving object model that performs movement set in advance from the time point of the initial traffic scene based on the initial state of the autonomous driving vehicle model, the initial state of the moving object model, and the road environment; and
determine whether or not the autonomous driving vehicle model and the moving object model are in a low evaluation relationship based on the future state of the autonomous driving vehicle model and the future state of the moving object model,
wherein the performance of the autonomous driving is evaluated based on the result of determination of the low evaluation relationship.

4. The autonomous driving evaluation apparatus according to claim 1, wherein the processor is further configured to:
calculate a future state of the autonomous driving vehicle model when the autonomous driving is performed from the time point of the initial traffic scene and a future state of the moving object model that performs movement set in advance from the time point of the initial traffic scene based on the initial state of the autonomous driving vehicle model, the initial state of the moving object model, and the road environment; and
determine whether or not the autonomous driving vehicle model and the moving object model are in a low evaluation relationship based on the future state of the autonomous driving vehicle model and the future state of the moving object model,
wherein the performance of the autonomous driving is evaluated based on the result of determination of the low evaluation relationship.

5. An autonomous driving evaluation method performed by an autonomous driving evaluation apparatus for evaluating an autonomous driving by a simulation, wherein the autonomous driving evaluation apparatus comprises a memory that stores a program and a processor configured to execute the stored program, the method comprising:
setting an initial traffic scene, in which an autonomous driving vehicle model and a moving object model are involved, by setting: (i) an initial state of the autonomous driving vehicle model on which the autonomous driving is performed, (ii) an initial state of the moving object model, and (iii) a road environment in which the autonomous driving vehicle model and the moving object model are disposed;
calculating a past traffic scene candidate, in which the autonomous driving vehicle model and the moving object model are involved, at a past time point back traced from a time point of the initial traffic scene based on the initial traffic scene, wherein, in the calculating of the past traffic scene candidate, the states of the autonomous driving vehicle model and the states of the moving object model at the time points that are time points back traced from a time point of initial traffic scene by a predetermined time length are repeatedly calculated;
determining whether both the state of the autonomous driving vehicle model and the state of the moving object model are in a legal compliance state which was set in advance;
based upon both the state of the autonomous driving vehicle model and the state of the moving object model being in the legal compliance state, setting the past traffic scene candidate as a past traffic scene; and
evaluating a performance of the autonomous driving based on the past traffic scene.

6. The autonomous driving evaluation method according to claim 5, further comprising:
generating a preset number of comparison past traffic scenes at the past time point by minutely varying the past traffic scene; and
calculating an autonomous driving reflected scene after a time set in advance elapses from the past traffic scene under a state in which the autonomous driving is performed on the autonomous driving vehicle model, and calculating a comparison autonomous driving reflected scene after a time set in advance elapses from the comparison past traffic scene under a state in which the autonomous driving is performed on the autonomous driving vehicle model,
wherein, in the evaluating, the performance of the autonomous driving is evaluated based on the initial traffic scene, the past traffic scene, the comparison past traffic scene, the autonomous driving reflected scene, and the comparison autonomous driving reflected scene.

7. The autonomous driving evaluation method according to claim 6, further comprising:
calculating a future state of the autonomous driving vehicle model when the autonomous driving is performed from the time point of the initial traffic scene and a future state of the moving object model that performs movement set in advance from the time point of the initial traffic scene based on the initial state of the autonomous driving vehicle model, the initial state of the moving object model, and the road environment; and
determining whether or not the autonomous driving vehicle model and the moving object model are in a low evaluation relationship set in advance based on the future state of the autonomous driving vehicle model and the future state of the moving object model,
wherein, in the evaluating, the performance of the autonomous driving is evaluated based on the result of determination performed in the determining.

8. The autonomous driving evaluation method according to claim 5, further comprising:
calculating a future state of the autonomous driving vehicle model when the autonomous driving is performed from the time point of the initial traffic scene and a future state of the moving object model that performs movement set in advance from the time point of the initial traffic scene based on the initial state of the autonomous driving vehicle model, the initial state of the moving object model, and the road environment; and
determining whether or not the autonomous driving vehicle model and the moving object model are in a low evaluation relationship set in advance based on the future state of the autonomous driving vehicle model and the future state of the moving object model, wherein, in the evaluating, the performance of the autonomous driving is evaluated based on the result of determination performed in the determining.

* * * * *